(12) United States Patent
Lee et al.

(10) Patent No.: US 8,906,731 B2
(45) Date of Patent: Dec. 9, 2014

(54) PATTERNING SLIT SHEET ASSEMBLY, ORGANIC LAYER DEPOSITION APPARATUS, METHOD OF MANUFACTURING ORGANIC LIGHT-EMITTING DISPLAY APPARATUS, AND THE ORGANIC LIGHT-EMITTING DISPLAY APPARATUS

(75) Inventors: Myung-Ki Lee, Yongin (KR);
Sung-Bong Lee, Yongin (KR);
Myong-Hwan Choi, Yongin (KR);
Mu-Hyun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/461,669

(22) Filed: May 1, 2012

(65) Prior Publication Data
US 2012/0298970 A1 Nov. 29, 2012

(30) Foreign Application Priority Data
May 27, 2011 (KR) .......................... 10-2011-0050842

(51) Int. Cl.
| H01L 21/00 | (2006.01) |
| C23C 14/12 | (2006.01) |
| H01L 51/00 | (2006.01) |
| C23C 14/04 | (2006.01) |
| H01L 51/56 | (2006.01) |

(52) U.S. Cl.
CPC ............ *H01L 51/0011* (2013.01); *C23C 14/12* (2013.01); *C23C 14/042* (2013.01); *H01L 51/56* (2013.01)

USPC ............................................... 438/82; 257/40

(58) Field of Classification Search
USPC ............................................... 438/82; 257/40
See application file for complete search history.

(56) References Cited

U.S. PATENT DOCUMENTS

| 4,416,217 A | 11/1983 | Nakamura et al. |
| 4,468,648 A | 8/1984 | Uchikune |

(Continued)

FOREIGN PATENT DOCUMENTS

| CN | 1476279 A | 2/2004 |
| CN | 1489419 A | 4/2004 |

(Continued)

OTHER PUBLICATIONS

Patent Abstracts of Japan, and English machine translation of Japanese Publication 2001-052862, 20 pages.

(Continued)

*Primary Examiner* — Charles Garber
*Assistant Examiner* — Brigitte Paterson
(74) *Attorney, Agent, or Firm* — Christie, Parker & Hale, LLP

(57) ABSTRACT

A patterning slit sheet assembly to perform a deposition process to deposit a thin film on a substrate in a fine pattern. A patterning slit sheet assembly includes a patterning slit sheet including a slit unit, and a non-slit region that is located along edges of the slit unit, the patterning slit sheet being smaller than the substrate in at least one of a first direction or a second direction perpendicular to the first direction; a frame combined with the patterning slit sheet to support the patterning slit sheet; and a shielding unit extending on at least one inner side of the frame and overlapping an area including the edges of the slit unit.

10 Claims, 12 Drawing Sheets

(56) References Cited

U.S. PATENT DOCUMENTS

| | | | |
|---|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1* | 3/2004 | Marcus et al. ............... 257/40 |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Oshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Azia et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |

(56) References Cited

U.S. PATENT DOCUMENTS

| | | |
|---|---|---|
| 2007/0157879 A1 | 7/2007 | Yotsuya et al. |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0202421 A1 | 8/2008 | Allen et al. |
| 2008/0216741 A1 | 9/2008 | Ling |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1* | 7/2009 | Kim et al. ............... 118/719 |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1* | 3/2010 | Sung et al. ............... 438/22 |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Lee et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1* | 5/2011 | Lee et al. ............... 427/66 |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 A2 | 11/1982 |
| JP | 2-247372 | 10/1990 |
| JP | 04-272170 | 9/1992 |

(56) References Cited

FOREIGN PATENT DOCUMENTS

| | | |
|---|---|---|
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-068054 | 3/2000 |
| JP | 2000-282219 | 10/2000 |
| JP | 2000-323277 | 11/2000 |
| JP | 2001-28325 A2 | 1/2001 |
| JP | 2001-052862 | 2/2001 |
| JP | 2001-093667 | 4/2001 |
| JP | 2002-075638 A | 3/2002 |
| JP | 2002-175878 | 6/2002 |
| JP | 2002-348659 A2 | 12/2002 |
| JP | 2003-003250 | 1/2003 |
| JP | 2003-077662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |
| JP | 2003-347394 A2 | 12/2003 |
| JP | 2004-035964 A2 | 2/2004 |
| JP | 2004-043898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 A | 6/2004 |
| JP | 2004-199919 | 7/2004 |
| JP | 2004-225058 | 8/2004 |
| JP | 2004-342455 A2 | 12/2004 |
| JP | 2004-349101 A | 12/2004 |
| JP | 2004-355975 | 12/2004 |
| JP | 2005-044592 | 2/2005 |
| JP | 2005-101505 | 4/2005 |
| JP | 2005-122980 A | 5/2005 |
| JP | 2005-163099 | 6/2005 |
| JP | 2005-165015 A2 | 6/2005 |
| JP | 2005-174843 A | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 A | 8/2006 |
| JP | 2006-210038 A2 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2007-047293 | 2/2007 |
| JP | 2007-66862 | 3/2007 |
| JP | 2007-146219 | 6/2007 |
| JP | 2007-157886 | 6/2007 |
| JP | 2007-186740 | 7/2007 |
| JP | 2007-242436 | 9/2007 |
| JP | 2007-291506 A2 | 11/2007 |
| JP | 2008-19477 A2 | 1/2008 |
| JP | 2008-108628 | 5/2008 |
| JP | 2008-121098 | 5/2008 |
| JP | 2008-521165 A | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-019243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 A2 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 | 4/2000 |
| KR | 10-2000-0023929 | 5/2000 |
| KR | 2001-0024652 | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 | 11/2001 |
| KR | 10-2002-0000201 | 1/2002 |
| KR | 2002-0001555 | 1/2002 |
| KR | 2002-0025760 | 4/2002 |
| KR | 10-2002-0050922 | 6/2002 |
| KR | 10-2002-0090934 | 12/2002 |
| KR | 10-2002-0091457 A | 12/2002 |
| KR | 10-2003-0001745 | 1/2003 |
| KR | 2003-0034730 A | 5/2003 |
| KR | 10-2003-0043012 A | 6/2003 |
| KR | 2003-0046090 | 6/2003 |
| KR | 2003-0069684 A | 8/2003 |
| KR | 10-0405080 B1 | 11/2003 |
| KR | 10-0406059 B1 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 B1 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 B1 | 10/2005 |
| KR | 10-0532657 B1 | 12/2005 |
| KR | 10-2006-0006178 A | 1/2006 |
| KR | 10-2006-0008602 | 1/2006 |
| KR | 10-2006-0018745 | 3/2006 |
| KR | 10-2006-0020050 | 3/2006 |
| KR | 10-2006-0045225 A | 5/2006 |
| KR | 10-2006-0049050 | 5/2006 |
| KR | 10-2006-0051746 A | 5/2006 |
| KR | 10-2006-0053926 A | 5/2006 |
| KR | 10-2006-0056706 | 5/2006 |
| KR | 10-2006-0058459 | 5/2006 |
| KR | 10-2006-0059068 | 6/2006 |
| KR | 10-2006-0059323 A | 6/2006 |
| KR | 10-2006-0060994 | 6/2006 |
| KR | 10-2006-0065978 | 6/2006 |
| KR | 10-2006-0073367 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |

(56) References Cited

FOREIGN PATENT DOCUMENTS

| | | |
|---|---|---|
| KR | 10-2006-0081943 A | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 | 11/2006 |
| KR | 10-0646160 B1 | 11/2006 |
| KR | 10-2006-0123944 A | 12/2006 |
| KR | 10-0687007 B1 | 2/2007 |
| KR | 10-2007-0025164 | 3/2007 |
| KR | 10-0696547 B1 | 3/2007 |
| KR | 10-0696550 B1 | 3/2007 |
| KR | 10-0697663 | 3/2007 |
| KR | 10-0698033 B1 | 3/2007 |
| KR | 10-0700466 B1 | 3/2007 |
| KR | 10-2007-0035796 | 4/2007 |
| KR | 10-2007-0037848 A | 4/2007 |
| KR | 10-0711885 B1 | 4/2007 |
| KR | 10-2007-0050793 | 5/2007 |
| KR | 10-2009-0053417 A | 5/2007 |
| KR | 10-0723627 B1 | 5/2007 |
| KR | 10-2007-0056190 A | 6/2007 |
| KR | 10-0726132 B1 | 6/2007 |
| KR | 10-0736218 B1 | 7/2007 |
| KR | 10-0739309 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 A | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 B1 | 10/2007 |
| KR | 10-0770653 B1 | 10/2007 |
| KR | 10-2007-0112668 | 11/2007 |
| KR | 10-2007-0114094 A | 11/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 | 1/2008 |
| KR | 10-0815265 | 3/2008 |
| KR | 10-2008-0036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 A | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 A | 7/2008 |
| KR | 10-2008-0062212 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0052828 A | 5/2009 |
| KR | 10-0899279 B1 | 5/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 | 9/2009 |
| KR | 10-2009-0094911 A | 9/2009 |
| KR | 10-2009-0097453 | 9/2009 |
| KR | 10-2009-0107702 | 10/2009 |
| KR | 10-0922763 A | 10/2009 |
| KR | 10-2010-0000128 | 1/2010 |
| KR | 10-2010-0000129 | 1/2010 |
| KR | 10-2010-0002381 A | 1/2010 |
| KR | 10-2010-0026655 | 3/2010 |
| KR | 10-2010-0038088 A | 4/2010 |
| KR | 10-2010-0044606 A | 4/2010 |
| KR | 10-2010-0047796 A | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | WO99/25894 | 5/1999 |
| WO | 03043067 A1 | 5/2003 |
| WO | WO2004016406 A1 | 2/2004 |
| WO | 2008004792 A1 | 1/2008 |

OTHER PUBLICATIONS

Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080.
Korean Patent Abstracts, Publication No. 1020020088662, dated Nov. 29, 2002, for corresponding Korean Patent 10-0463212.
Korean Patent Abstracts, Publication No. 1020050045619, dated May 17, 2005, for corresponding Korean Patent 10-0520159.
Korean Patent Abstracts, Publication No. 1020040062203, dated Jul. 7, 2004, for corresponding Korean Patent 10-0646160.
Korean Patent Abstracts, Publication No. 1020060101987, dated Sep. 27, 2006, for corresponding Korean Patent 10-0687007.
Korean Patent Abstracts, Publication No. 1020020056238, dated Jul. 10, 2002, for corresponding Korean Patent 10-0698033.
Korean Patent Abstracts, Publication No. 1020050078637, dated Aug. 5, 2005, for corresponding Korean Patent 10-0700466.
Korean Patent Abstracts, Publication No. 1020070025164, dated Mar. 8, 2007, for corresponding Korean Patent 10-0711885.

(56) References Cited

OTHER PUBLICATIONS

Korean Patent Abstracts, Publication No. 1020020034272, dated May 9, 2002, for corresponding Korean Patent 10-0726132.
Korean Patent Abstracts, Publication No. 1020060126267, dated Dec. 7, 2006, for corresponding Korean Patent 10-0797787.
Korean Patent Abstracts, Publication No. 1020010062735, dated Jul. 7, 2001, for corresponding Korean Patent 10-0827760.
Korean Patent Abstracts, Publication No. 1020080038650, dated May 7, 2008, for corresponding Korean Patent 10-0839380.
Korean Patent Abstracts, Publication No. 1020070050793, dated May 16, 2007, for corresponding Korean Patent 10-0815265.
Korean Patent Abstracts, Publication No. 102000-0019254 dated Apr. 6, 2000, for corresponding Korean Patent No. 10-2007-0101842.
English Abstract, Publication No. KR20080002189 dated Jan. 4, 2008, for corresponding Korean Patent 10-0800125.
Korean Notice of Allowance dated Nov. 25, 2011 for Korean Patent Application No. 10-2010-0014277, 5 pages.
Korean Notice of Allowance dated Sep. 28, 2011 for Korean Patent Application No. 10-2009-0042357, 5 pages.
Korean Notice of Allowance dated Jan. 13, 2012 for Korean Patent Application No. 10-2009-0056529, 5 pages.
Korean Office action dated Feb. 1, 2012 for Korean Application No. 10-2010-0011196, 4 pages.
Korean Office action dated Feb. 1, 2012 for Korean Application No. 10-2010-0013848, 3 pages.
Japanese Office Action, dated Aug. 21, 2012, corresponding to JP 2010-145075.
Japanese Office Action, dated Sep. 4, 2012, corresponding to JP 2010-152846.
Korean Office Notice of Allowance, dated Sep. 1, 2012, corresponding to KR 10-2010-0013848.
Korean Office Notice of Allowance, dated Sep. 1, 2012, corresponding to KR 10-2010-0009160.
Korean Office Action, dated Sep. 1, 2012, corresponding to KR 10-2010-0010136.
Korean Office Notice of Allowance dated Apr. 30, 2012, for Korean Patent application 10-2010-0066992.
Korean Office Notice of Allowance dated Jul. 20, 2012, for Korean Patent application 10-2010-0003545.
U.S. Notice of Allowance, dated Mar. 18, 2013, corresponding to U.S. Appl. No. 12/795,001.
U.S. Office action dated Dec. 20, 2012, corresponding to U.S. Appl. No. 12/984,289.
U.S. Office action dated Feb. 26, 2013, corresponding to U.S. Appl. No. 12/794,093.
U.S. Office action dated Mar. 15, 2013, corresponding to U.S. Appl. No. 12/813,786.
U.S. Office action dated Mar. 18, 2013, corresponding to U.S. Appl. No. 12/984,231.
U.S. Office action dated Mar. 19, 2013, corresponding to U.S. Appl. No. 13/194,759.
U.S. Office action dated Mar. 22, 2013, corresponding to U.S. Appl. No. 12/987,569.
U.S. Office action dated May 7, 2013, corresponding to U.S. Appl. No. 12/820,270.
U.S. Office action dated Jun. 11, 2013, corresponding to U.S. Appl. No. 12/862,125.
U.S. Office action dated Jun. 26, 2013, corresponding to U.S. Appl. No. 12/794,093.
U.S. Office action dated Jul. 17, 2013, corresponding to U.S. Appl. No. 12/984,231.
U.S. Office action dated Aug. 13, 2013, corresponding to U.S. Appl. No. 13/194,759.
U.S. Office action dated Oct. 11, 2013, corresponding to U.S. Appl. No. 12/907,396.
U.S. Office action dated Oct. 21, 2013, corresponding to U.S. Appl. No. 12/987,569.
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Aug. 24, 2012, issued to KR 10-2010-0066993 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, (5 pages).
KIPO Notice of Allowance dated Sep. 1, 2012, for Korean Patent application 10-2010-0013847 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).

(56) References Cited

OTHER PUBLICATIONS

KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Mar. 17, 2014, for U.S. Appl. No. 12/950,361 (48 pages).
U.S. Office Action dated Mar. 23, 2012 for U.S. Appl. No. 12/849,193 (17 pages).
U.S. Office action dated May 21, 2014, issued to U.S. Appl. No. 13/014,225 (15 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated May 6, 2014, issued to U.S. Appl. No. 13/467,998 (21 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Office action dated Sep. 12, 2012, in U.S. Appl. No. 12/815,673 (26 pages).

\* cited by examiner

PATTERNING SLIT SHEET ASSEMBLY, ORGANIC LAYER DEPOSITION APPARATUS, METHOD OF MANUFACTURING ORGANIC LIGHT-EMITTING DISPLAY APPARATUS, AND THE ORGANIC LIGHT-EMITTING DISPLAY APPARATUS

CROSS-REFERENCE TO RELATED APPLICATION

This application claims priority to and the benefit of Korean Patent Application No. 10-2011-0050842, filed on May 27, 2011 in the Korean Intellectual Property Office, the entire content of which is incorporated herein by reference.

BACKGROUND

1. Field

Aspects of embodiments of the present invention relate to a patterning slit sheet assembly, an organic layer deposition apparatus, a method of manufacturing an organic light-emitting display apparatus, and the organic light-emitting display apparatus.

2. Description of the Related Art

Organic light-emitting display apparatuses have a larger viewing angle, better contrast characteristics, and a faster response rate than other display devices, and thus have drawn attention as next-generation display devices.

An organic light-emitting display device includes an intermediate layer, which includes an organic emission layer, between a first electrode and a second electrode that are arranged opposite to each other. The electrodes and the intermediate layers may be formed by various methods, one of which is a deposition method.

Typical high-definition organic light-emitting display apparatuses are relatively large. However, especially on a large substrate, it is difficult to form a thin film, such as the intermediate layer, in a fine pattern, and the luminous efficiency of the organic emission layer included in the intermediate layer may vary according to a deposition process. Thus, manufacturing of conventional organic light-emitting display devices having satisfactory driving voltage, current density, brightness, color purity, light-emission efficiency, and lifespan characteristics has been limited.

SUMMARY

According to an aspect of embodiments of the present invention, a patterning slit sheet assembly, an organic layer deposition apparatus, and a method of manufacturing an organic light-emitting display apparatus perform a deposition process to deposit a thin film in a fine pattern. According to another aspect of embodiments of the present invention, an organic light-emitting display apparatus is manufactured having a thin film deposited in a fine pattern.

According to an embodiment of the present invention, a patterning slit sheet assembly for depositing a thin film in a pattern on a substrate spaced apart from the patterning slit sheet assembly by a predetermined distance, at least one of the substrate or the patterning slit sheet assembly being movable relative to the other, includes a patterning slit sheet including a slit unit, and a non-slit region that is located along edges of the slit unit, the patterning slit sheet being smaller than the substrate in at least one of a first direction or a second direction perpendicular to the first direction; a frame combined with the patterning slit sheet to support the patterning slit sheet; and a shielding unit extending on at least one inner side of the frame and overlapping an area including the edges of the slit unit.

The shielding unit may be arranged on two inner side surfaces that face each other from among inner side surfaces of the frame.

The shielding unit may be formed covering inner side surfaces of the frame.

The slit unit may overlap a deposition area on the substrate, and may be larger than the deposition area.

Inner edges of the shielding unit may correspond to edge portions of a deposition area on the substrate.

According to another embodiment of the present invention, an organic layer deposition apparatus for forming an organic layer on a substrate includes a deposition source for discharging a deposition material; a deposition source nozzle unit arranged at a side of the deposition source and including a plurality of deposition source nozzles arranged in a first direction; and a patterning slit sheet assembly which includes a patterning slit sheet including a slit unit, and a non-slit region that is located along edges of the slit unit, the patterning slit sheet being smaller than the substrate in at least one of the first direction or a second direction perpendicular to the first direction; a frame combined with the patterning slit sheet to support the patterning slit sheet; and a shielding unit extending on at least one inner side of the frame and overlapping an area including the edges of the slit unit, the substrate being spaced apart from the organic layer deposition apparatus by a predetermined distance, and at least one of the substrate or the organic layer deposition apparatus being movable relative to the other.

The shielding unit may be arranged on inner side surfaces which face each other and are positioned in a direction perpendicular to the first direction, from among inner side surfaces of the frame.

Deposition may be performed while the substrate is moved relative to the organic layer deposition apparatus in the first direction.

The deposition source, the deposition source nozzle unit, and the patterning slit sheet assembly may be integrally formed as one body.

The deposition source, the deposition source nozzle unit, and the patterning slit sheet assembly may be integrally connected as one body by at least one connection member that guides movement of the deposition material.

The at least one connection member may seal a space between the deposition source, the deposition source nozzle unit, and the patterning slit sheet assembly.

Deposition source nozzles of the plurality of deposition source nozzles may be tilted at an angle.

The plurality of deposition source nozzles may include deposition source nozzles arranged in two rows in the first direction, and deposition source nozzles of the plurality of deposition source nozzles in the two rows may be tilted toward each other.

According to another embodiment of the present invention, an organic layer deposition apparatus for forming an organic layer on a substrate includes a deposition source for discharging a deposition material; a deposition source nozzle unit arranged at a side of the deposition source and including a plurality of deposition source nozzles arranged in a first direction; a patterning slit sheet assembly which includes a patterning slit sheet including a slit unit, and a non-slit region that is located along edges of the slit unit, the patterning slit sheet being smaller than the substrate in at least one of the first direction or a second direction perpendicular to the first direction; a frame combined with the patterning slit sheet to support the patterning slit sheet; and a shielding unit extending on at least one inner side of the frame and overlapping an area including the edges of the slit unit; and a barrier plate assembly including a plurality of barrier plates arranged between the deposition source nozzle unit and the patterning slit sheet in the first direction and partitioning a deposition space between the deposition source nozzle unit and the patterning slit sheet assembly into a plurality of sub-deposition spaces, the substrate being spaced apart from the organic layer deposition apparatus by a predetermined distance, and at least one of the substrate or the organic layer deposition apparatus being movable relative to the other.

The shielding unit may be arranged on inner side surfaces which face each other and are positioned in the first direction, from among inner side surfaces of the frame.

Deposition may be performed while the substrate is moved relative to the organic layer deposition apparatus.

The plurality of barrier plates may extend in the second direction.

The barrier plate assembly may include a first barrier plate assembly including a plurality of first barrier plates, and a second barrier plate assembly including a plurality of second barrier plates.

The first barrier plates and the second barrier plates may extend in the second direction.

The first barrier plates may be arranged to respectively correspond to the second barrier plates.

The deposition source may be spaced apart from the barrier plate assembly.

The barrier plate assembly may be spaced apart from the patterning slit sheet assembly.

According to another embodiment of the present invention, a method of manufacturing an organic light-emitting display apparatus includes forming a first electrode on a substrate; forming an intermediate layer including an organic emission layer on the first electrode; and forming a second electrode on the intermediate layer, and the forming of the intermediate layer is performed using an organic layer deposition apparatus including: a deposition source for discharging a deposition material; a deposition source nozzle unit arranged at a side of the deposition source and including a plurality of deposition source nozzles arranged in a first direction; and a patterning slit sheet assembly including: a patterning slit sheet including a slit unit, and a non-slit region that is located along edges of the slit unit, the patterning slit sheet being smaller than the substrate in at least one of the first direction or a second direction perpendicular to the first direction; a frame combined with the patterning slit sheet to support the patterning slit sheet; and a shielding unit extending on at least one inner side of the frame and overlapping an area including the edges of the slit unit, the substrate being spaced apart from the organic layer deposition apparatus by a predetermined distance, and deposition being performed while at least one of the substrate or the organic layer deposition apparatus is moved relative to the other in the first direction.

According to another embodiment of the present invention, a method of manufacturing an organic light-emitting display apparatus includes forming a first electrode on a substrate; forming an intermediate layer including an organic emission layer on the first electrode; and forming a second electrode on the intermediate layer, and the forming of the intermediate layer is performed using an organic layer deposition apparatus including: a deposition source for discharging a deposition material; a deposition source nozzle unit arranged at a side of the deposition source and including a plurality of deposition source nozzles arranged in a first direction; a patterning slit sheet assembly including: a patterning slit sheet including a slit unit, and a non-slit region that is located along edges of the slit unit, the patterning slit sheet being smaller than the substrate in at least one of the first direction or a second direction perpendicular to the first direction; a frame combined with the patterning slit sheet to support the patterning slit sheet; and a shielding unit extending on at least one inner side of the frame and overlapping an area including the edges of the slit unit; and a barrier plate assembly including a plurality of barrier plates arranged between the deposition source nozzle unit and the patterning slit sheet assembly in the first direction and partitioning a space between the deposition source nozzle unit and the patterning slit sheet assembly into a plurality of sub-deposition spaces, the substrate being spaced apart from the organic layer deposition apparatus by a predetermined distance, and deposition being performed while at least one of the substrate or the organic layer deposition apparatus is moved relative to the other.

According to another embodiment of the present invention, an organic light-emitting display apparatus is manufactured using one of the methods.

BRIEF DESCRIPTION OF THE DRAWINGS

The above and other features of the present invention will become more apparent by describing in further detail some exemplary embodiments thereof with reference to the attached drawings in which.

DETAILED DESCRIPTION

Some exemplary embodiments of the present invention will be described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

Figure 1:
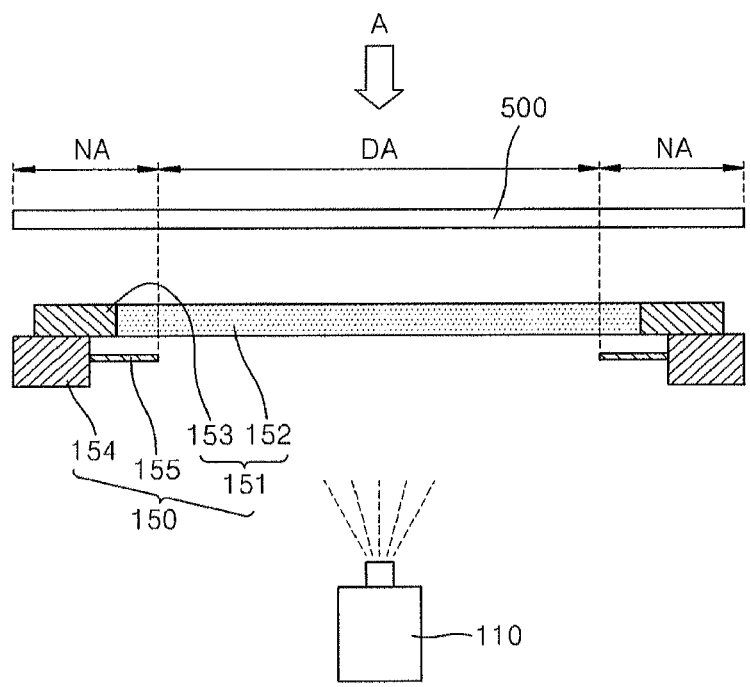
FIG. 1 is a schematic cross-sectional view of a patterning slit sheet assembly according to an embodiment of the present invention.
Figure 2:
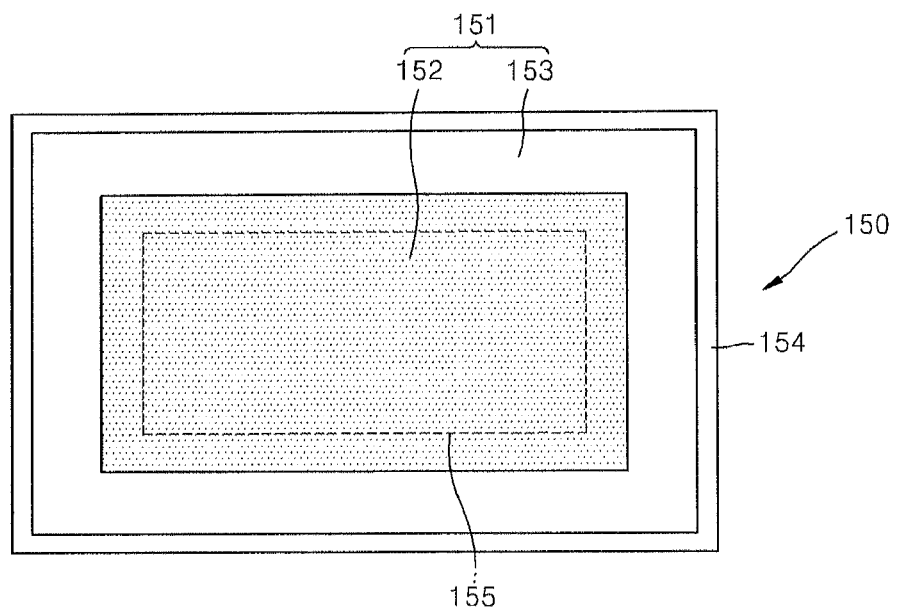
FIG. 2 is a plan view of the patterning slit sheet assembly of FIG. 1, viewed in a direction indicated by arrow "A"
Figure 3A:
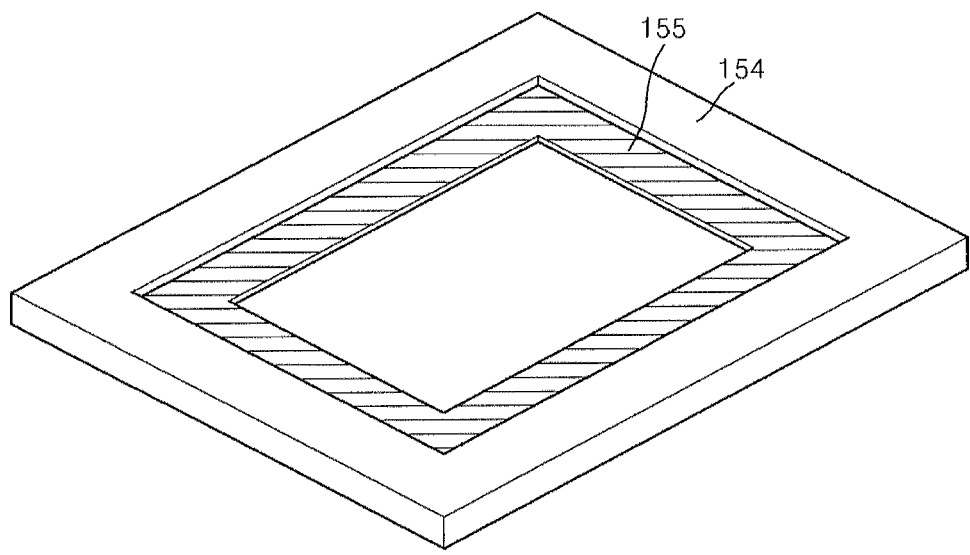
FIG. 3A is a perspective view of a frame and a shielding unit of the patterning slit sheet assembly of FIG. 1.
Figure 3B:
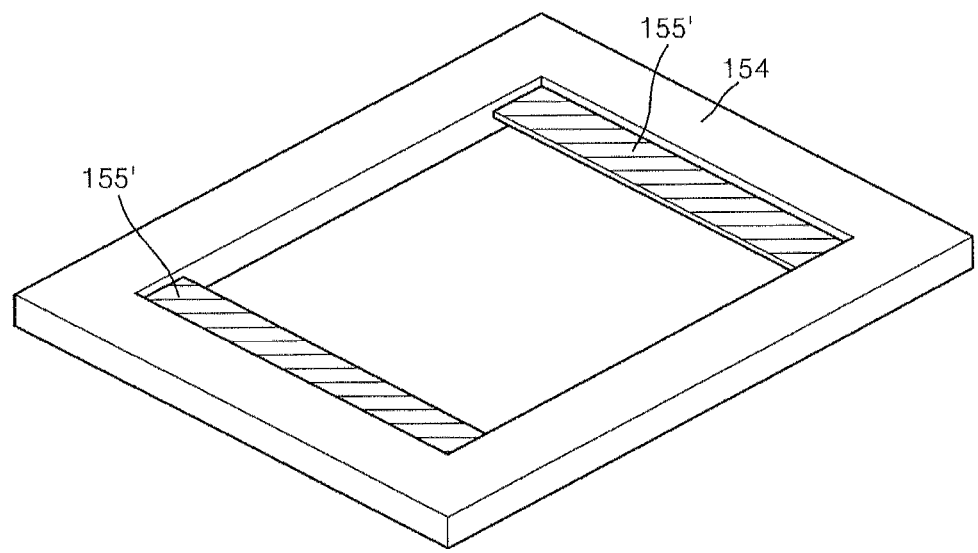
FIG. 3B is a perspective view of a frame and a shielding unit of a patterning slit sheet assembly according to another embodiment of the present invention.

FIG. 1 is a schematic cross-sectional view of a patterning slit sheet assembly 150 according to an embodiment of the present invention; FIG. 2 is a plan view of the patterning slit sheet assembly 150 viewed in a direction indicated by the arrow "A" in FIG. 1; and FIG. 3A is a perspective view of a frame and a shielding unit of the patterning slit sheet assembly 150. FIG. 3B is a perspective view of a frame and a shielding unit of a patterning slit sheet assembly according to another embodiment of the present invention.

Referring to FIG. 1, the patterning slit sheet assembly 150, in one embodiment, includes a patterning slit sheet 151, a frame 154, and a shielding unit 155.

Particularly, FIG. 1 illustrates a deposition process performed on a substrate 500 by using the patterning slit sheet assembly 150, according to an embodiment of the present invention. A deposition source 110 is disposed on a side of (e.g., below) the patterning slit sheet assembly 150, and the substrate 500 is disposed on an opposite side of (e.g., above) the patterning slit sheet assembly 150.

The patterning slit sheet 151, in one embodiment, includes a slit unit 152 and a non-slit region 153. The slit unit 152, in one embodiment, includes a plurality of slits (not shown) formed in a predetermined pattern. For purposes of clarity, the plurality of slits of the slit unit 152 are not particularly illustrated in FIGS. 1 and 2.

A deposition material contained in the deposition source 110 passes through the plurality of slits of the slit unit 152 and is then deposited on the substrate 500.

In the non-slit region 153, any patterns including slits are not formed. The patterning slit sheet 151 may be formed according to one of various methods. For example, the slit unit 152 may be formed by forming the plurality of slits by selectively etching a metal thin film, and the remaining region of the metal thin film that is not etched may be used as the non-slit region 153.

The patterning slit sheet 151, in one embodiment, is combined with the frame 154. The frame 154 is formed in a lattice shape, similar to a window frame. The frame 154 may be combined with one surface of the non-slit region 153 of the patterning slit sheet 151. In one embodiment, the frame 154 and the patterning slit sheet 151 are combined in such a manner that a predetermined tensile force is applied to the patterning slit sheet 151.

In particular, a degree of pattern precision of the patterning slit sheet 151 during a deposition process may be affected by a manufacturing error and/or a thermal expansion error of the patterning slit sheet 151. A counterforce technique may be used to minimize or reduce a manufacturing error of the patterning slit sheet 151. This is described according to one embodiment in further detail below. First, a tensile force is applied to the patterning slit sheet 151 by applying pressure to the patterning slit sheet 151 from the inside to the outside thereof. Next, a compression force is applied to the frame 154 in an opposite direction to the direction in which the external tensile force is applied to the patterning slit sheet 151, such that the compression force is in equilibrium with the external tensile force applied to the patterning slit sheet 151. Next, the frame 154 and the patterning slit sheet 151 are combined, such as by welding, for example. Lastly, the external tensile force applied to the patterning slit sheet 151, which is in equilibrium with the compression force applied to the frame 154, is removed so as to apply the tensile force to the patterning slit sheet 151 via the frame 154. In one embodiment, when such precise extension, compression, and welding techniques as described above are used, the patterning slit sheet 151 may be manufactured with a manufacturing error of 2 μm or less.

In one embodiment, a tensile force may be applied to the patterning slit sheet 151, such as to a predetermined degree or greater such that the patterning slit sheet 151 may be prevented or substantially prevented from being deformed (e.g., sagging) during the deposition process, and a compression force may be applied to the frame 154, such as to a predetermined degree or greater. However, when a compression force is applied to the frame 154 to the predetermined degree or greater, the frame is likely to be deformed. In particular, when the size of the patterning slit sheet 151 is increased to perform a deposition process on the substrate 500 that is a large substrate, a greater tensile force should be applied to the patterning slit sheet 151 and a compression force applied to the frame 154 should also be increased to correspond to the greater tensile force. The frame 154 to which the greater compression force is applied may bend, and a manufacturing process is not easy to perform when the weight of the frame 154 is significantly increased to prevent the frame from bending.

According to an embodiment of the present invention, the slit unit 152 of the patterning slit sheet 151 is formed to be larger than a deposition area on which a deposition process is to be performed, and the above-described problem is avoided.

This will now be described in further detail. Referring to FIG. 1, a deposition area DA is disposed between non-deposition areas NA on the substrate 500. The deposition material in the deposition source 110 passes through the patterning slit sheet 151 and reaches the deposition area DA on the substrate 500 to perform a deposition process.

The slit unit 152 overlaps with the deposition area DA and is larger than the deposition area DA. That is, the slit unit 152 partially overlaps with the non-deposition areas NA.

Therefore, the non-slit region 153 is smaller and the region of the slit unit 152 having the plurality of slits is wider. If a tensile force of the same degree is applied to the patterning slit sheet 151, the larger the slit unit 152, the higher degree to which the patterning slit sheet 151 may be tensile-strained due to the plurality of slits that pass through the patterning slit sheet 151. In other words, a degree to which the patterning slit sheet 151 is tensile-strained is high when the slit unit 152 is large, provided the tensile force of the same degree is applied.

Thus, the larger the slit unit 152, the less the tensile force that may be applied to the patterning slit sheet 151. Accordingly, a compression force applied to the frame 154 may be lessened. Thus, the frame 154 is prevented or substantially prevented from being deformed and the thickness of the frame 154 does not need to be increased, thereby facilitating the manufacturing process.

The shielding unit 155, in one embodiment, is formed on inner side surfaces of the frame 154. The shielding unit 155 may be formed covering inner side surfaces of the frame 154, as illustrated in FIG. 3A, or a shielding unit 155' may be formed on two inner side surfaces that face each other from among the inner side surfaces of the frame 154, as illustrated in FIG. 3B. The structure of the shielding unit 155 may vary according to shapes and sizes of the substrate 500 which is a target deposition substrate, the patterning slit sheet 151, and the frame 154.

The shielding unit 155 overlaps with the non-deposition areas NA and corresponds to edge portions of the deposition area DA, as illustrated in FIG. 1. Since the slit unit 152 is larger than the deposition area DA, as described above, the deposition material in the deposition source 110 may be deposited not only on the deposition area DA but also on the non-deposition areas NA. In this case, an organic layer is not likely to be formed in a desired pattern. However, this is prevented or substantially prevented by the shielding unit 155. In other words, the shielding unit 155 allows the deposition material in the deposition source 110 to be deposited only on the deposition area DA.

In one embodiment, the patterning slit sheet assembly 150 applies a tensile force to the patterning slit sheet 151 when the frame 154 and the patterning slit sheet 151 are combined with each other, thereby minimizing or reducing a manufacturing error of the patterning slit sheet 151 and preventing or substantially preventing the patterning slit sheet 151 from being deformed. Accordingly, a deposition process may be performed to deposit a thin film in a fine pattern on a substrate 500.

In one embodiment, since the slit unit 152 of the patterning slit sheet 151 may be formed to be large, and particularly, to be larger than the deposition area DA, a tensile force applied to the patterning slit sheet 151 is reduced to lessen a compression force to be applied to the frame 154, thereby preventing or substantially preventing the frame 154 from being deformed.

The shielding unit 155 is formed on the frame 154 such that the deposition material may not be deposited on the non-deposition areas NA, but on the deposition area DA, thereby increasing the efficiency of the deposition process to deposit a thin film in a fine pattern.

Figure 4:
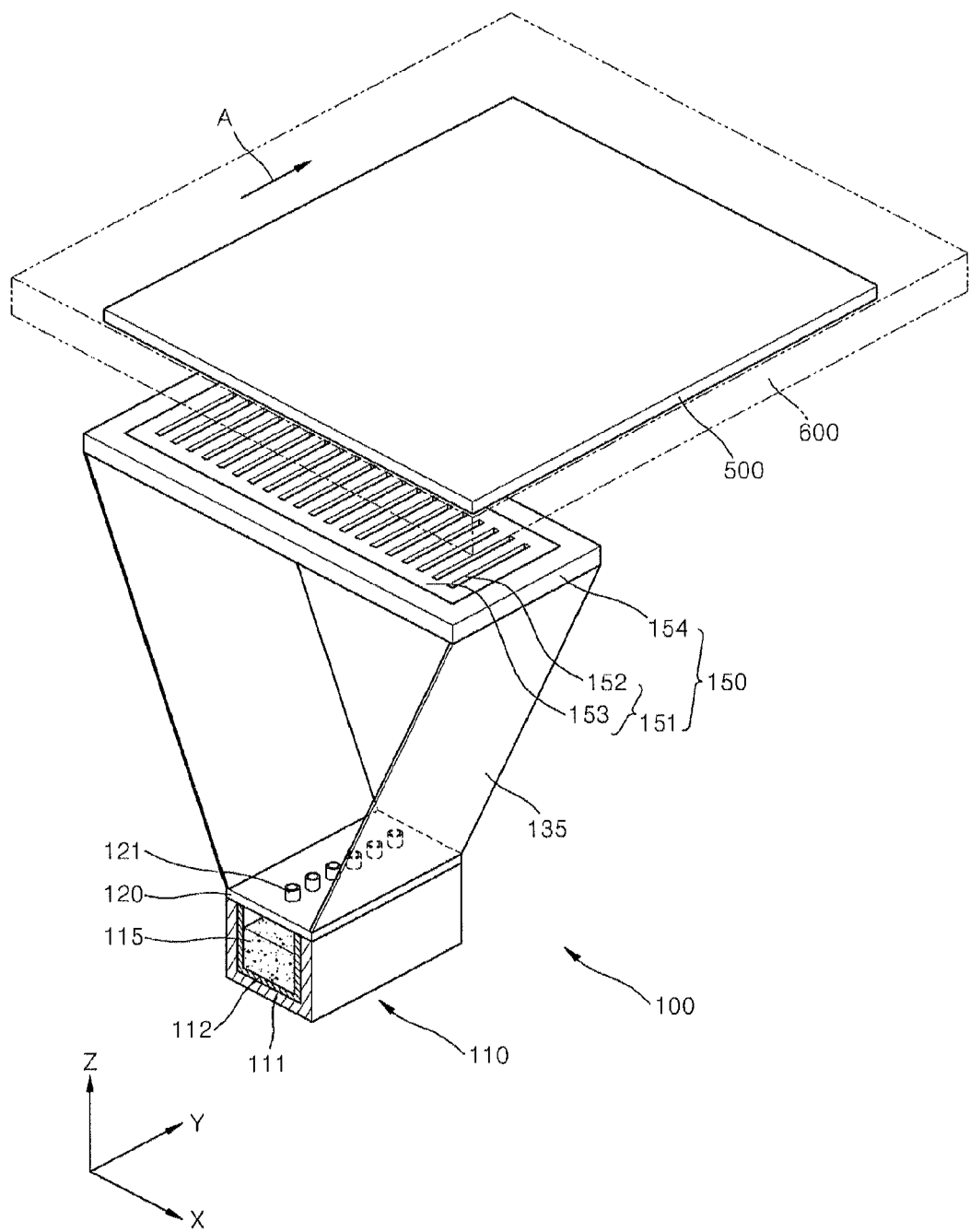
FIG. 4 is a schematic perspective view of an organic layer deposition apparatus according to an embodiment of the present invention.
Figure 5:
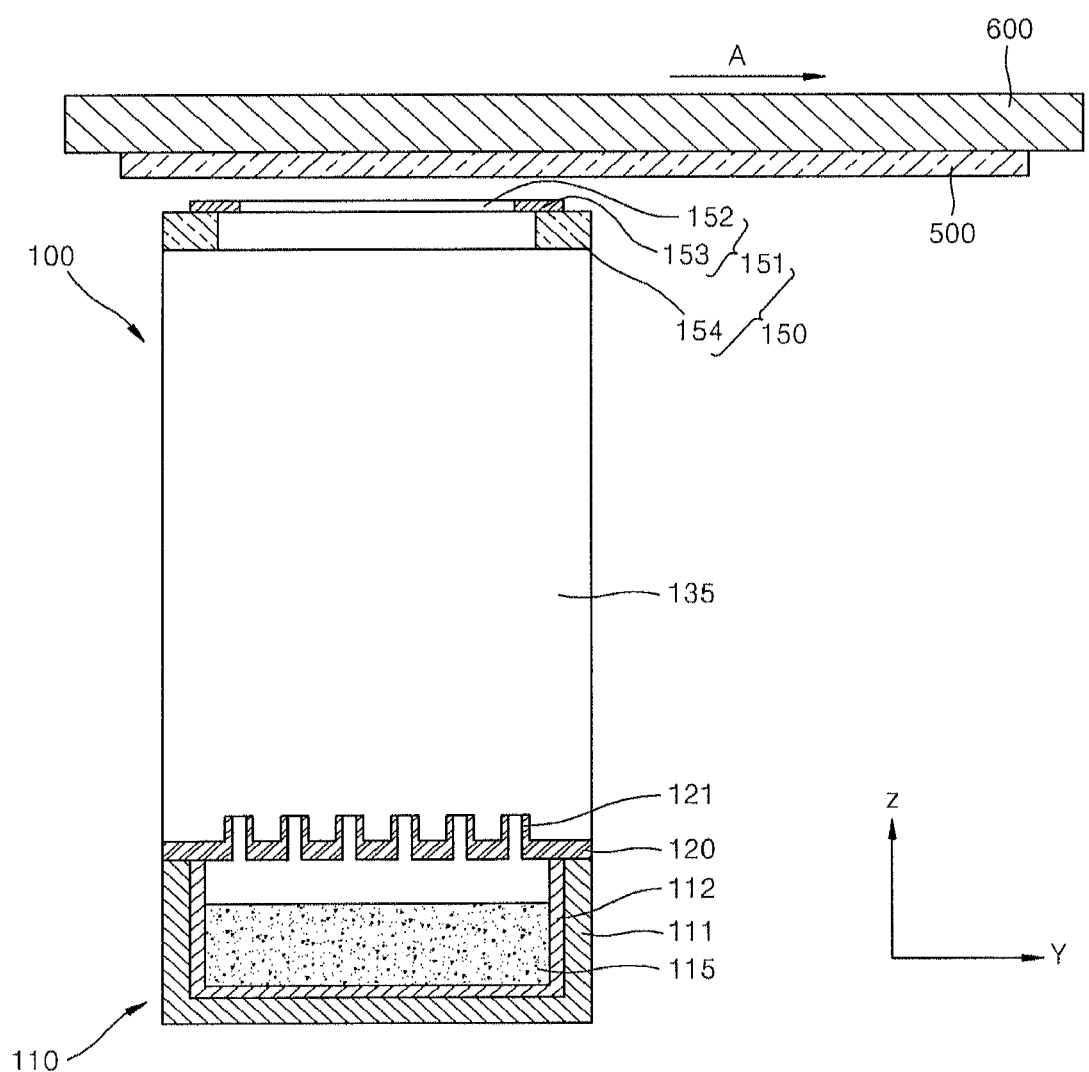
FIG. 5 is a schematic side sectional view of the organic layer deposition apparatus of FIG. 4.
Figure 6:
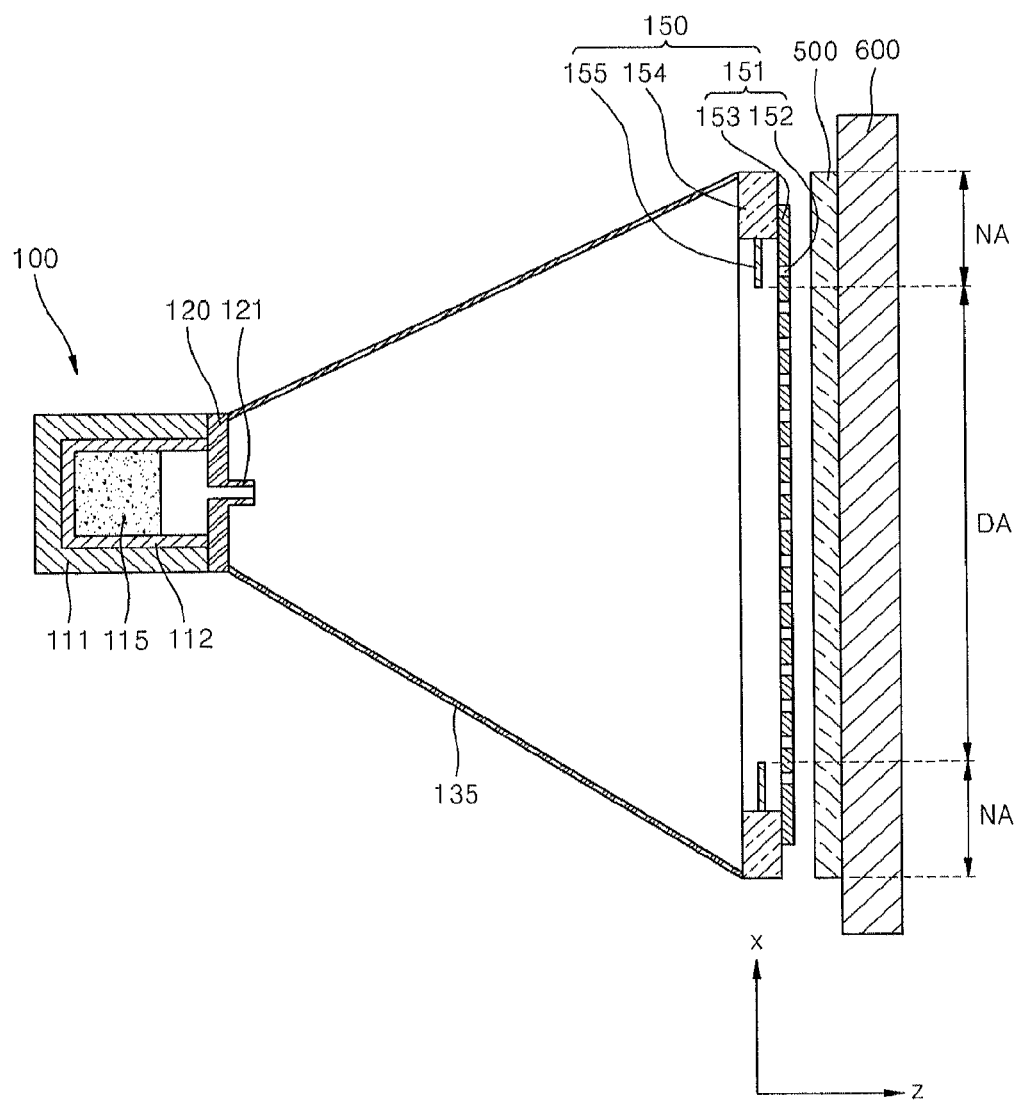
FIG. 6 is a schematic front sectional view of the organic layer deposition apparatus of FIG. 4.

FIG. 4 is a schematic perspective view of an organic layer deposition apparatus 100 according to an embodiment of the present invention; FIG. 5 is a schematic side sectional view of the organic layer deposition apparatus 100; and FIG. 6 is a schematic front sectional view of the organic layer deposition apparatus 100. Referring to FIGS. 4 through 6, the organic layer deposition apparatus 100 includes a deposition source 110, a deposition source nozzle unit 120, and the patterning slit sheet assembly 150.

In one embodiment, a deposition material 115 discharged from the deposition source 110 passes through the deposition source nozzle unit 120 and the patterning slit sheet assembly 150 and is then deposited onto the substrate 500 in a desired pattern. Although not shown, such a deposition process that uses the organic layer deposition apparatus 100 may be performed in a chamber that is maintained in a high vacuum. In addition, the temperature of the patterning slit sheet 151 is sufficiently lower than that of the deposition source 110. In one embodiment, the temperature of the patterning slit sheet 151 may be about 100° C. or less. The temperature of the patterning slit sheet 151 should be sufficiently low so as to minimize or reduce thermal expansion of the patterning slit sheet 151.

The substrate 500 may be a substrate for flat panel displays, for example. A large substrate, such as a mother glass, for manufacturing a plurality of flat panel displays, may be used as the substrate 500. However, other substrates may be used. In one embodiment, deposition is performed while the substrate 500 is moved relative to the organic layer deposition apparatus 100. The substrate 500 may be disposed on an electrostatic chuck 600 and may be then transferred.

In particular, in a conventional fine metal mask (FMM) deposition method, the size of an FMM is equal to the size of a substrate. Thus, since the size of the FMM has to be increased as the substrate becomes larger, it is neither straightforward to manufacture a large FMM nor to extend an FMM to be accurately aligned with a pattern.

In the organic layer deposition apparatus 100 of the present invention, deposition may be performed while the organic layer deposition apparatus 100 or the substrate 500 is moved relative to the other. In other words, deposition may be continuously performed while the substrate 500, which is disposed such as to face the organic layer deposition apparatus 100, is moved in a Y-axis direction. That is, deposition may be performed in a scanning manner while the substrate 500 is moved in a direction indicated by the arrow "A" in FIGS. 4 and 5.

In the organic layer deposition apparatus 100 according to one embodiment, the patterning slit sheet 151 may be significantly smaller than an FMM used in a conventional deposition method. In one embodiment, in the organic layer deposition apparatus 100, deposition is continuously performed (e.g., in a scanning manner) while the substrate 500 is moved in the Y-axis direction. Thus, the length of the patterning slit sheet 151 in at least one of the X-axis or the Y-axis directions may be significantly less than the length of the substrate 500 in at least one of the X-axis or the Y-axis directions. As described above, since the patterning slit sheet 151 may be formed to be significantly smaller than a FMM used in a conventional deposition method, it is relatively easy to manufacture the patterning slit sheet 151 according to embodiments of the present invention. In addition, using the patterning slit sheet 151, which is smaller than the FMM used in the conventional deposition method, is more convenient in other processes, including etching and other subsequent processes, such as precise extension, welding, moving, and cleaning processes, compared to the conventional deposition method using the larger FMM. This is especially advantageous for a relatively large display device.

The deposition source 110 that contains and heats the deposition material 115 is disposed at a side facing the substrate 500. The deposition material 115 is vaporized in the deposition source 110 and deposited on the substrate 500.

In one embodiment, the deposition source 110 includes a crucible 112 filled with the deposition material 115, and a cooling block 111 that heats the crucible 112 to vaporize the deposition material 115 in the crucible 112 toward a side of the crucible 112, and in particular, toward the deposition source nozzle unit 120. The cooling block 111 prevents or substantially prevents radiation of heat from the crucible 112 to the outside. The cooling block 111 may include a heater (not shown) that heats the crucible 112.

The deposition source nozzle unit 120 is disposed at a side of the deposition source 110, and in particular, at the side of the deposition source 110 facing the substrate 500. The deposition source nozzle unit 120, in one embodiment, includes a plurality of deposition source nozzles 121 arranged at intervals (e.g., equal intervals) in the Y-axis direction (e.g., a scanning direction of the substrate 500). The deposition material 115 that is vaporized in the deposition source 110 passes through the deposition source nozzle unit 120 toward the substrate 500. As described above, in one embodiment, the deposition source nozzle unit 120 includes the plurality of deposition source nozzles 121 arranged in the Y-axis direction (e.g., the scanning direction of the substrate 500), and the size of a pattern formed of the deposition material 115 discharged through the slit unit 152 of the patterning slit sheet 151 is affected by the size of the deposition source nozzles 121 (since there may be only one line of the deposition source nozzles 121 in the X-axis direction). Thus, no shadow zone may be formed on the substrate 500. In one embodiment, since the plurality of deposition source nozzles 121 are arranged in the scanning direction of the substrate 500, even if there is a difference in flux between the plurality of deposition source nozzles 121, the difference may be compensated for and deposition uniformity may be maintained constant.

The patterning slit sheet assembly 150 that includes the patterning slit sheet 151, the frame 154, and the shielding unit 155, is disposed between the deposition source 110 and the substrate 500. The patterning slit sheet 151 includes the slit unit 152 and the non-slit region 153. In the slit unit 152, the plurality of slits are formed in an X-axis direction. The deposition material 115 that is vaporized in the deposition source 110 passes through the deposition source nozzle unit 120 and the patterning slit sheet 151, and particularly, the slit unit 152, toward the substrate 500.

In one embodiment, the structure of the patterning slit sheet assembly 150 that includes the patterning slit sheet 151, the frame 154, and the shielding unit 155, may be the same as described above with respect to FIGS. 1 through 3B, and thus further description thereof will not be repeated here.

The deposition source 110 and the deposition source nozzle unit 120 coupled to the deposition source 110 may be disposed apart from the patterning slit sheet assembly 150 by a predetermined distance. In one embodiment, the deposition source 110 and the deposition source nozzle unit 120 coupled to the deposition source 110 may be connected to the patterning slit sheet assembly 150 by connection members 135. In one embodiment, the deposition source 110, the deposition source nozzle unit 120, and the patterning slit sheet assembly 150 may be integrally formed as one body by being connected to each other via the connection members 135. The connection members 135 may guide the deposition material 115, which is discharged through the deposition source nozzles 121, to move straight and to not flow in the X-axis direction. In one embodiment, as illustrated in FIG. 4, the connection members 135 are formed only on left and right sides of the deposition source 110, the deposition source nozzle unit 120, and the patterning slit sheet assembly 150 to guide the deposition material 115 to not flow in the X-axis direction; however, aspects of the present invention are not limited thereto. For example, in another embodiment, the connection member 135 may be formed in the configuration of a sealed box to guide flow of the deposition material 115 in both the X-axis and Y-axis directions.

As described above, the organic layer deposition apparatus 100 according to one embodiment performs deposition while being moved relative to the substrate 500. In one embodiment, in order to move the organic layer deposition apparatus 100 relative to the substrate 500, the patterning slit sheet assembly 150 is separated from the substrate 500 by a predetermined distance.

In particular, in the conventional deposition method using a FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In the organic layer deposition apparatus 100 according to the present invention, the patterning slit sheet assembly 150 is disposed to be separated from the substrate 500 by a predetermined distance. Thus, it is possible to prevent or substantially prevent defects from occurring when the patterning slit sheet assembly 150 contacts the substrate 500 during the deposition process.

In one embodiment, since the patterning slit sheet assembly 150, and particularly, the patterning slit sheet 151 is formed to be smaller than the substrate 500, the patterning slit sheet assembly 150 may be easily manufactured.

Figure 7:
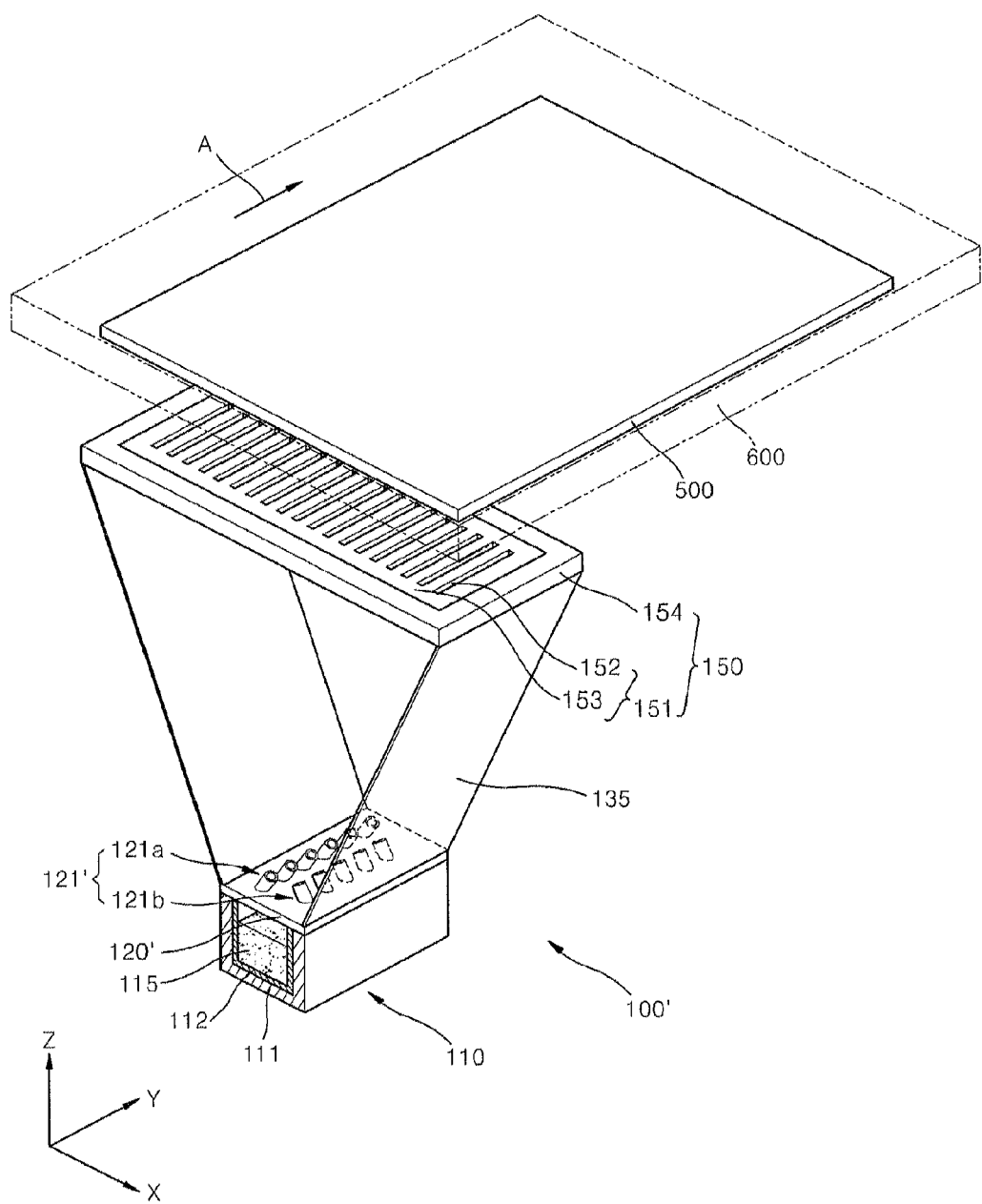
FIG. 7 is a schematic perspective view of an organic layer deposition apparatus according to another embodiment of the present invention.

FIG. 7 is a schematic perspective view of an organic layer deposition apparatus 100' according to another embodiment of the present invention. Referring to FIG. 7, the organic layer deposition apparatus 100' includes the deposition source 110, a deposition source nozzle unit 120', and the patterning slit sheet assembly 150.

The deposition source 110, in one embodiment, includes the crucible 112 filled with the deposition material 115, and the cooling block 111 that heats the crucible 112 to vaporize the deposition material 115 in the crucible 112 toward the deposition source nozzle unit 120'. The deposition source nozzle unit 120' is disposed at a side of the deposition source 110. The deposition source nozzle unit 120' includes a plurality of deposition source nozzles 121' arranged in the Y-axis direction. The patterning slit sheet assembly 150 is disposed between the deposition source 110 and the substrate 500. In one embodiment, the deposition source 110 and the deposition source nozzle unit 120' may be connected to the patterning slit sheet assembly 150 by the connection members 135.

In one embodiment, the structure of the patterning slit sheet assembly 150 that includes the patterning slit sheet 151, the frame 154, and the shielding unit 155, may be the same as that of embodiments described above, and thus further description thereof will not be repeated here.

In one embodiment, the plurality of deposition source nozzles 121' formed in the deposition source nozzle unit 120' are tilted at a predetermined angle, unlike in the deposition source nozzle unit 120 described above with reference to FIGS. 4 through 6. In one embodiment, the deposition source nozzles 121' may include deposition source nozzles 121a and 121b arranged in two rows. The deposition source nozzles 121a and 121b may be arranged in two rows to alternate in a zigzag pattern. The deposition source nozzles 121a and 121b may be tilted at a predetermined angle on an X-Z plane.

In one embodiment, the deposition source nozzles 121a and 121b are arranged to be tilted at a predetermined angle. In one embodiment, the deposition source nozzles 121a in a first row and the deposition source nozzles 121b in a second row may be tilted to face each other. For example, the deposition source nozzles 121a of the first row in a left part of the deposition source nozzle unit 120' may be tilted to face a right side portion of the patterning slit sheet assembly 150, and the deposition source nozzles 121b of the second row in a right part of the deposition source nozzle unit 120' may be tilted to face a left side portion of the patterning slit sheet assembly 150.

Due to the structure of the organic layer deposition apparatus 100' according to one embodiment, the deposition of the deposition material 115 may be adjusted to lessen a thickness variation between the center and the end portions of an organic layer on the substrate 500 and improve thickness uniformity of the organic layer. Moreover, utilization efficiency of the deposition material 115 may also be improved.

Figure 8:
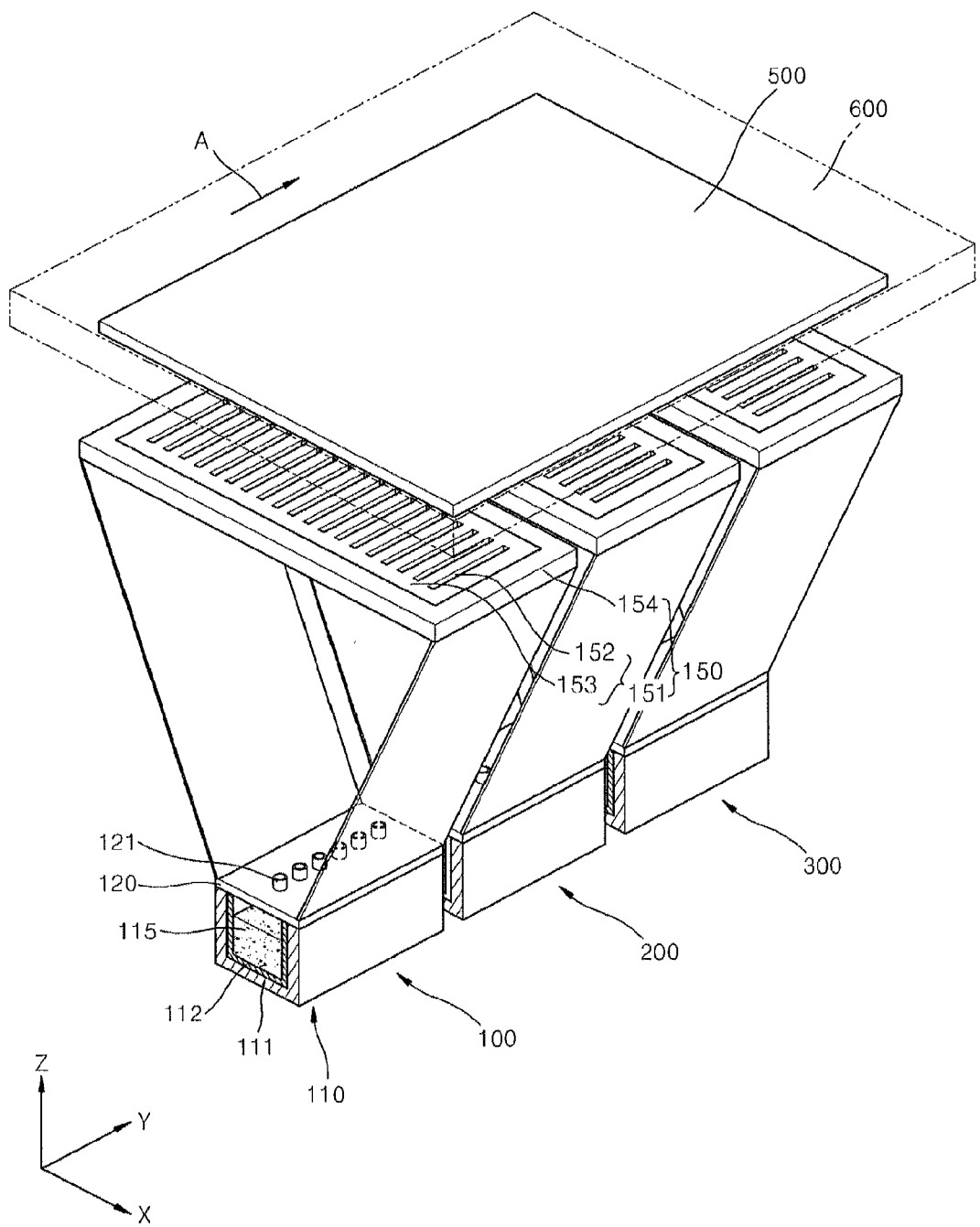
FIG. 8 is a schematic perspective view of an organic layer deposition apparatus according to another embodiment of the present invention.

FIG. 8 is a schematic perspective view of an organic layer deposition apparatus according to another embodiment of the present invention.

Referring to FIG. 8, the organic layer deposition apparatus may include a plurality of organic layer deposition apparatuses, such as first, second, and third deposition apparatuses 100, 200, and 300, each of which may have a same structure as the organic layer deposition apparatus 100 illustrated in FIGS. 4 through 6. The organic layer deposition apparatus according to the embodiment shown in FIG. 8 may include a multi-deposition source unit that consists of a plurality of deposition sources and that concurrently (e.g., simultaneously) discharge different deposition materials, such as for respectively forming a red (R) emission layer, a green (G) emission layer, and a blue (B) emission layer.

In one embodiment, the organic layer deposition apparatus includes the first organic layer deposition apparatus 100, the second organic layer deposition apparatus 200, and the third organic layer deposition apparatus 300. Each of the first to third organic layer deposition apparatuses 100, 200, 300 may have the same structure as the organic layer deposition apparatus 100 described with reference to FIGS. 4 through 6, and thus a detailed description thereof will not be repeated here.

Also, the structure of the patterning slit sheet assembly 150 that includes the patterning slit sheet 151, the frame 154, and the shielding unit 155 may be the same as that of the organic layer deposition apparatus 100 described above, and thus further description thereof will not be repeated here.

The deposition sources of the first organic layer deposition apparatus 100, the second organic layer deposition apparatus 200, and the third organic layer deposition apparatus 300 may contain different deposition materials, respectively. For example, the first organic layer deposition apparatus 100 may contain a deposition material for forming a red (R) emission layer, the second organic layer deposition apparatus 200 may contain a deposition material for forming a green (G) emission layer, and the third organic layer deposition apparatus 300 may contain a deposition material for forming a blue (B) emission layer.

In one embodiment, the red (R) emission layer, the green (G) emission layer, and the blue (B) emission layer may be concurrently (e.g., simultaneously) formed by using the multi-deposition source unit. Thus, a time needed to manufacture an organic light emitting display device may be significantly reduced. In addition, the organic light emitting display device may be manufactured using a reduced number of chambers, such that equipment costs may also be significantly reduced.

Although not illustrated in FIG. 8, the patterning slit sheet assemblies 150 of the first organic layer deposition apparatus 100, the second organic layer deposition apparatus 200, and the third organic layer deposition apparatus 300 may be arranged to be offset by a distance (e.g., a constant distance) with respect to each other, thereby preventing or substantially preventing deposition regions corresponding to the patterning slit sheets 150 from overlapping with one another on a substrate 500. In other words, if the first organic layer deposition apparatus 100, the second organic layer deposition apparatus 200, and the third organic layer deposition apparatus 300 are used to respectively deposit the R emission layer, the G emission layer, and the B emission layer, then a plurality of slits of the slit unit 152 of the patterning slit sheet 151 of the first organic layer deposition apparatus 100, a plurality of slits of the slit unit 152 of the patterning slit sheet 151 of the second organic layer deposition apparatus 200, and a plurality of slits of the slit unit 152 of the patterning slit sheet 151 of the third organic layer deposition apparatus 300 may be arranged to not be aligned with respect to one another, to respectively form the R emission layer, the G emission layer, and the B emission layer in different regions of the substrate 500.

In one embodiment, the deposition materials for respectively forming the R emission layer, the G emission layer, and the B emission layer may be vaporized at different temperatures. Therefore, the temperatures of deposition sources of the respective first to third organic layer deposition apparatuses 100, 200, 300 may be set to be different.

Although the organic layer deposition apparatus according to embodiment shown in FIG. 8 includes the three organic layer deposition apparatuses 100, 200, 300, embodiments of the present invention are not limited thereto. For example, an organic layer deposition apparatus according to another embodiment of the present invention may include a plurality of organic layer deposition apparatuses, each of which contains a different deposition material. For example, an organic layer deposition apparatus according to another embodiment of the present invention may include five organic layer deposition apparatuses respectively containing materials for an R emission layer, a G emission layer, a B emission layer, an auxiliary R' layer of the R emission layer, and an auxiliary G' layer of the G emission layer.

As described above, an organic layer deposition apparatus may include a plurality of organic layer deposition apparatuses to concurrently (e.g., simultaneously) form a plurality of organic layers, thereby improving manufacturing yield and deposition efficiency. In addition, the overall manufacturing process may be simplified, and the manufacturing costs may be reduced.

Figure 9:
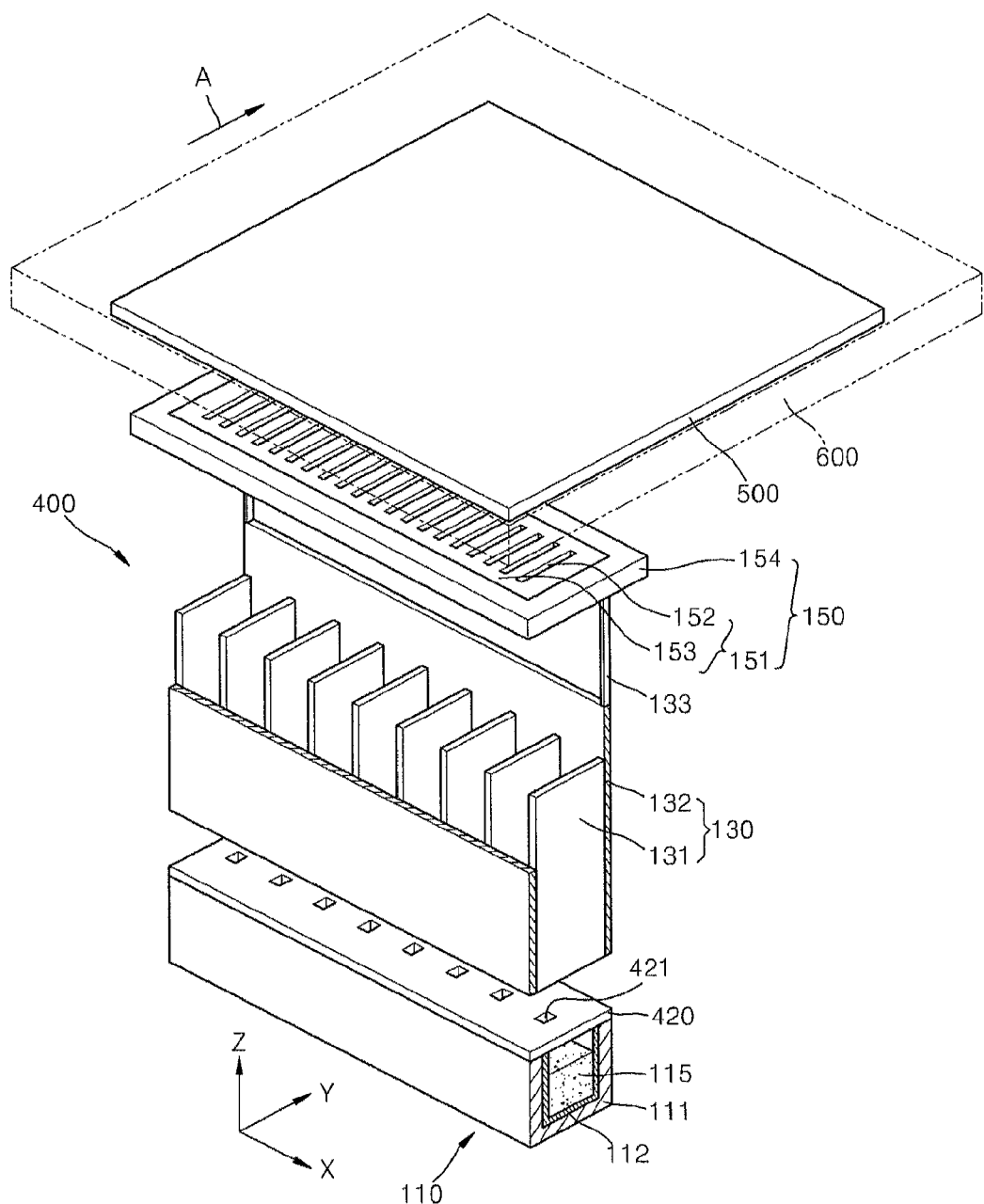
FIG. 9 is a schematic perspective view of an organic layer deposition apparatus according to another embodiment of the present invention.
Figure 10:
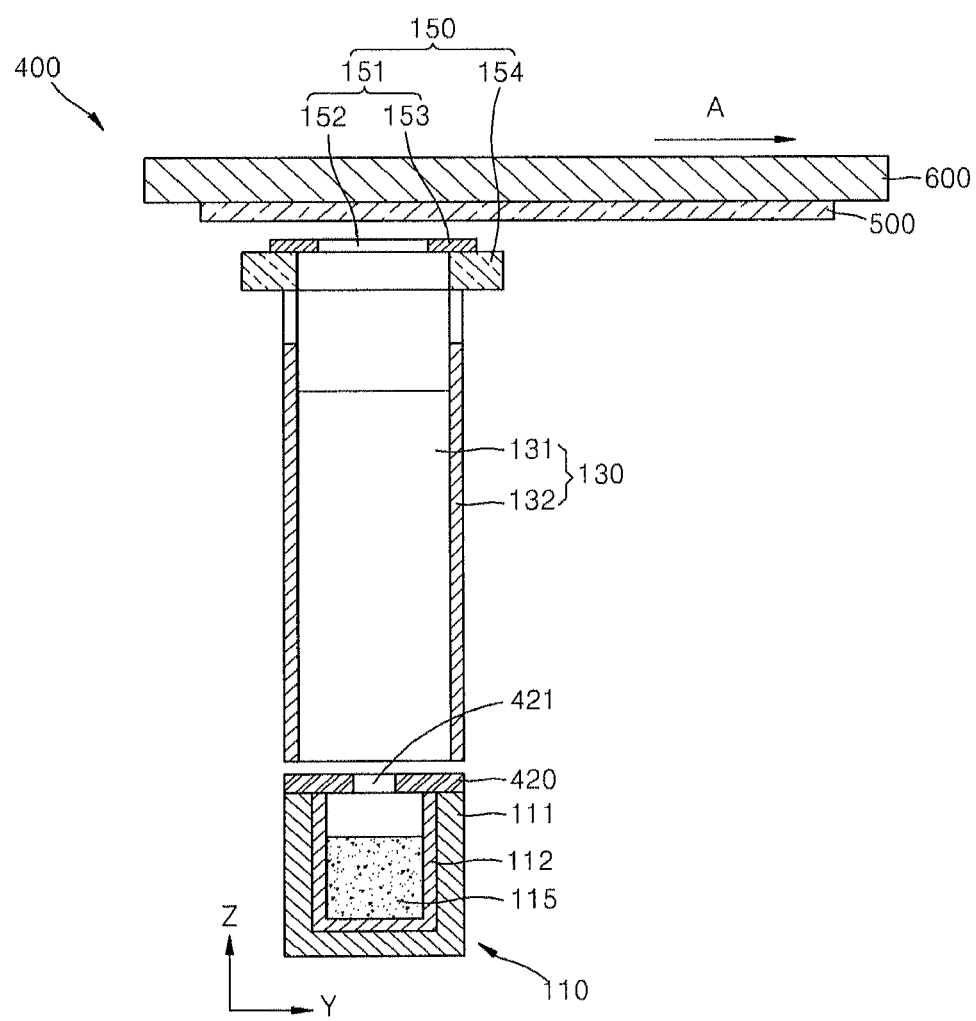
FIG. 10 is a schematic side sectional view of the organic layer deposition apparatus of FIG. 9.

FIG. 9 is a schematic perspective view of an organic layer deposition apparatus 400 according to another embodiment of the present invention; FIG. 10 is a schematic side sectional view of the organic layer deposition apparatus 400; and FIG. 11 is a schematic front sectional view of the organic layer deposition apparatus 400.

Figure 11:
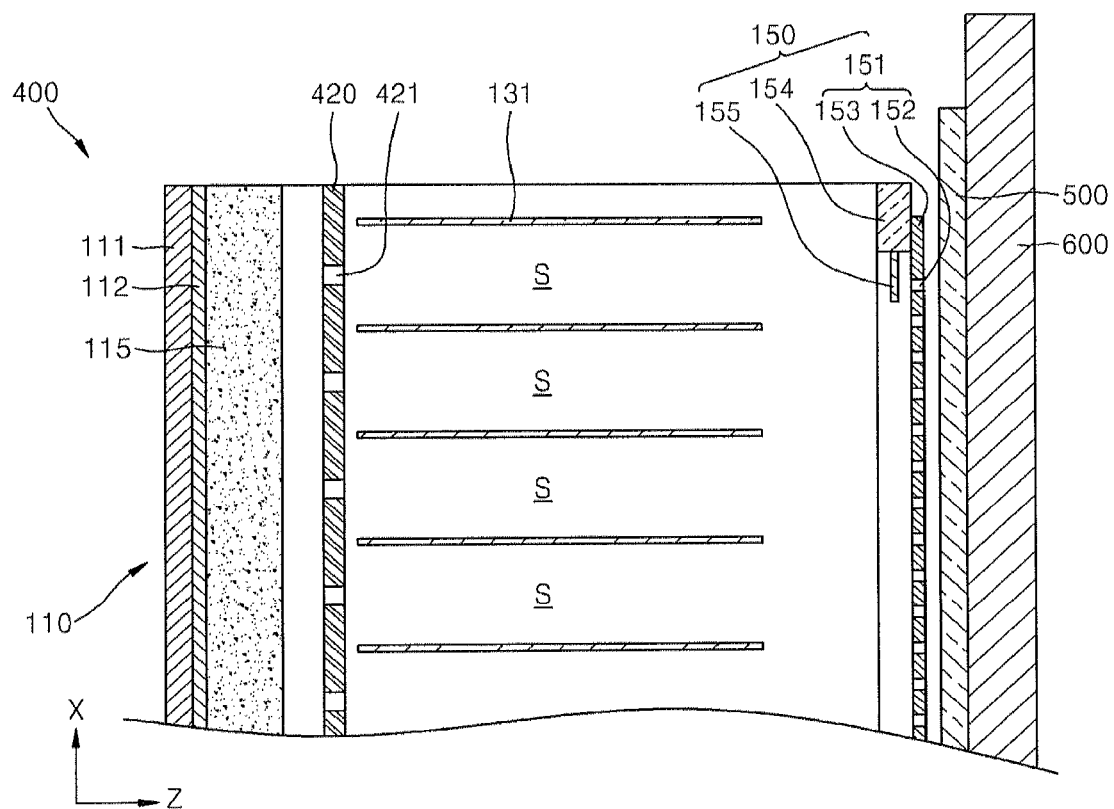
FIG. 11 is a schematic front sectional view of the organic layer deposition apparatus of FIG. 9.

Referring to FIGS. 9 through 11, the organic layer deposition apparatus 400 includes the deposition source 110, a deposition source nozzle unit 420, the patterning slit sheet assembly 150, and a barrier plate assembly 130. In one embodiment, although not illustrated in FIGS. 9 through 11 for purposes of clarity, the components of the organic layer deposition apparatus 400 may be disposed within a chamber that is maintained at an appropriate degree of vacuum. The chamber may be maintained at an appropriate degree of vacuum in order to allow the deposition material 115 to move in a substantially straight line through the organic layer deposition apparatus 400.

In the chamber, the substrate 500 that is a deposition target substrate is transferred by the electrostatic chuck 600. The substrate 500 may be a substrate for flat panel displays, for example. A large substrate, such as a mother glass, for manufacturing a plurality of flat panel displays, may be used as the substrate 500. However, other substrates may be employed.

In one embodiment, the substrate 500 may be moved relative to the organic layer deposition apparatus 400. For example, the substrate 500 may be moved in a direction of the arrow "A" relative to the organic layer deposition apparatus 400.

Similar to the embodiments described above, in the organic layer deposition apparatus 400 according to one embodiment, the patterning slit sheet assembly 150 may be significantly smaller than a FMM used in a conventional deposition method. In one embodiment, in the organic layer deposition apparatus 400, deposition is continuously performed (e.g., in a scanning manner) while the substrate 500 is moved (e.g., in the Y-axis direction). Thus, a length of the patterning slit sheet 151 (e.g., in the Y-axis direction) may be significantly less than a length of the substrate 500, and a width of the patterning slit sheet 151 (e.g., in the X-axis direction) and a width of the substrate 500 (e.g., in the X-axis direction) may be substantially equal to each other. However, in one embodiment, the width of the patterning slit sheet 151 in the X-axis direction may be less than the width of the substrate 500 in the X-axis direction, and deposition may be performed on the entire substrate 500 in the scanning manner while the substrate 500 or the organic layer deposition apparatus 400 is moved relative to the other.

As described above, since the patterning slit sheet 151 may be formed to be significantly smaller than a FMM used in a conventional deposition method, it is relatively easy to manufacture the patterning slit sheet 151 according to embodiments of the present invention.

The deposition source 110 that contains and heats the deposition material 115 is disposed at a side facing the substrate 500. In one embodiment, the deposition source 110 includes the crucible 112 filled with the deposition material 115, and the cooling block 111 surrounding the crucible 112. The cooling block 111 prevents or substantially prevents radiation of heat from the crucible 112 to the outside. The cooling block 111 may include a heater (not shown) that heats the crucible 112.

The deposition source nozzle unit 420 is disposed at a side of the deposition source 110, and in particular, at the side of the deposition source 110 facing the substrate 500. The deposition source nozzle unit 420, in one embodiment, includes a plurality of deposition source nozzles 421 that may be arranged at intervals (e.g., equal intervals) in the X-axis direction. The deposition material 115 that is vaporized in the deposition source 110 passes through the deposition source nozzles 421 of the deposition source nozzle unit 420 toward the substrate 500 that is a deposition target substrate.

The barrier plate assembly 130 is disposed at a side of the deposition source nozzle unit 420. The barrier plate assembly 130, in one embodiment, includes a plurality of barrier plates 131, and a barrier plate frame 132 that covers sides of the barrier plates 131. The plurality of barrier plates 131, in one embodiment, may be arranged parallel to each other at intervals (e.g., equal intervals) in the X-axis direction. In one embodiment, each of the barrier plates 131 may be arranged parallel to a Y-Z plane in FIG. 9, and may have a generally rectangular shape. The plurality of barrier plates 131 arranged as described above partition a deposition space between the deposition source nozzle unit 420 and the patterning slit sheet assembly 150 into a plurality of sub-deposition spaces S. In the organic layer deposition apparatus 400 according to one embodiment, as illustrated in FIG. 11, the deposition space is divided by the barrier plates 131 into the sub-deposition spaces S that respectively correspond to the deposition source nozzles 421 through which the deposition material 115 is discharged.

In one embodiment, the barrier plates 131 may be respectively disposed between adjacent deposition source nozzles 421. In other words, each of the deposition source nozzles 421 may be disposed between two adjacent barrier plates 131. In one embodiment, the deposition source nozzles 421 may be respectively located at the midpoints between pairs of adjacent barrier plates 131. However, the present invention is not limited to this structure. For example, in another embodiment, a plurality of deposition source nozzles 421 may be disposed between two adjacent barrier plates 131, and the deposition source nozzles 421 may be respectively located at the midpoint between the two adjacent barrier plates 131.

In one embodiment, since the barrier plates 131 partition the space between the deposition source nozzle unit 420 and the patterning slit sheet assembly 150 into the plurality of sub-deposition spaces S as described above, the deposition material 115 discharged through each of the deposition source nozzles 421 is not mixed with the deposition material 115 discharged through the other deposition source nozzles 421, passes through the slit unit 152 of the patterning slit sheet assembly 150, and is then deposited on the substrate 500. In other words, the barrier plates 131 guide the deposition material 115, which is discharged through the deposition source nozzles 421, to move straight (i.e. flow in the Z-axis direction).

As described above, the deposition material 115 may be directed to move straight by installing the barrier plates 131, such that a smaller shadow zone may be formed on the substrate 500 compared to an apparatus in which no barrier plates are installed. In one embodiment, the organic layer deposition apparatus 400 and the substrate 500 may be separated from each other by a predetermined distance. This will be described in further detail later herein.

In one embodiment, the barrier plate frame 132, which covers the sides of the barrier plates 131, maintains the positions of the barrier plates 131 and guides the deposition material 115, which is discharged through the deposition source nozzles 421 to not flow in the Y-axis direction.

The deposition source nozzle unit 420 and the barrier plate assembly 130 may be separated from each other by a predetermined distance. This may prevent or substantially prevent heat radiated from the deposition source unit 110 from being conducted to the barrier plate assembly 130. However, embodiments of the present invention are not limited thereto. For example, in another embodiment, an appropriate heat insulator (not shown) may be disposed between the deposition source nozzle unit 420 and the barrier plate assembly 130, and the deposition source nozzle unit 420 and the barrier plate assembly 130 may be bound together with the heat insulator therebetween.

In one embodiment, the barrier plate assembly 130 may be constructed to be detachable from the organic layer deposition apparatus 400. In the organic layer deposition apparatus 400 according to one embodiment, the deposition space may be enclosed by using the barrier plate assembly 130, such that the deposition material 115 that remains undeposited is mostly deposited within the barrier plate assembly 130. Thus, since the barrier plate assembly 130 may be constructed to be detachable from the organic layer deposition apparatus 400, when a large amount of the deposition material 115 lies in the barrier plate assembly 130 after a long deposition process, the barrier plate assembly 130 may be detached from the organic layer deposition apparatus 400 and then placed in a separate deposition material recycling apparatus in order to recover the deposition material 115. Due to the structure of the organic layer deposition apparatus 400 according to such an embodiment, a reuse rate of the deposition material 115 is increased, such that the deposition efficiency is improved and the manufacturing costs are reduced.

The patterning slit sheet assembly 150 is disposed between the deposition source 110 and the substrate 500. The frame 154 has a shape similar to a window frame, and is combined with the patterning slit sheet 151. The patterning slit sheet 151 includes the slit unit 152 and the non-slit region 153. In one embodiment, in the slit unit 152, a plurality of slits are formed in the X-axis direction and extend in the Y-axis direction.

In one embodiment, the structure of the patterning slit sheet assembly 150 that includes the patterning slit sheet 151, the frame 154, and the shielding unit 155 may be the same as described above with respect to the previously described embodiments, and thus further description will not be repeated here.

In the organic layer deposition apparatus 400 according to one embodiment, the total number of the plurality of slits of the slit unit 152 may be greater than that of the deposition source nozzles 421. Further, the total number of the plurality of slits of the slit unit 152 disposed between two adjacent barrier plates 131 may be greater than the total number of deposition source nozzles 421 disposed between two adjacent barrier plates 131. The number of the plurality of slits of the slit unit 152 may be equal to that of deposition patterns to be formed on the substrate 500.

The barrier plate assembly 130 and the patterning slit sheet assembly 150 may be disposed to be separated from each other by a predetermined distance, and may be connected by connection members 133.

In one embodiment, the temperature of the barrier plate assembly 130 may increase to 100° C. or greater due to the deposition source 110 having a high temperature. Therefore, the barrier plate assembly 130 and the patterning slit sheet assembly 150 may be separated from each other by the predetermined distance in order to prevent or substantially prevent the heat of the barrier plate assembly 130 from being conducted to the patterning slit sheet assembly 150.

As described above, the organic layer deposition apparatus 400 according one embodiment performs deposition while being moved relative to the substrate 500. In one embodiment, in order to move the organic layer deposition apparatus 400 relative to the substrate 500, the patterning slit sheet assembly 150 is separated from the substrate 500 by a predetermined distance. In one embodiment, in order to prevent or substantially prevent formation of a relatively large shadow zone on the substrate 500 when the patterning slit sheet assembly 150, and particularly, the patterning slit sheet 151 is disposed apart from the substrate 500, the barrier plates 131 are arranged between the deposition source nozzle unit 420 and the patterning slit sheet assembly 150 to force the deposition material 115 to move in a straight direction. Thus, the size of the shadow zone that may be formed on the substrate 500 may be significantly reduced.

In the organic layer deposition apparatus 400 according to an embodiment of the present invention, the patterning slit sheet assembly 150 is disposed apart from the substrate 500 by a predetermined distance. Thus, in embodiments of the present invention, defects can be prevented which might otherwise occur where a patterning slit sheet assembly contacts a substrate during a deposition process.

Also, in one embodiment, since the patterning slit sheet assembly 150, and particularly, the pattering slit sheet 151, is formed to be smaller than the substrate 500, the patterning slit sheet assembly 150 may be easily manufactured.

Figure 12:
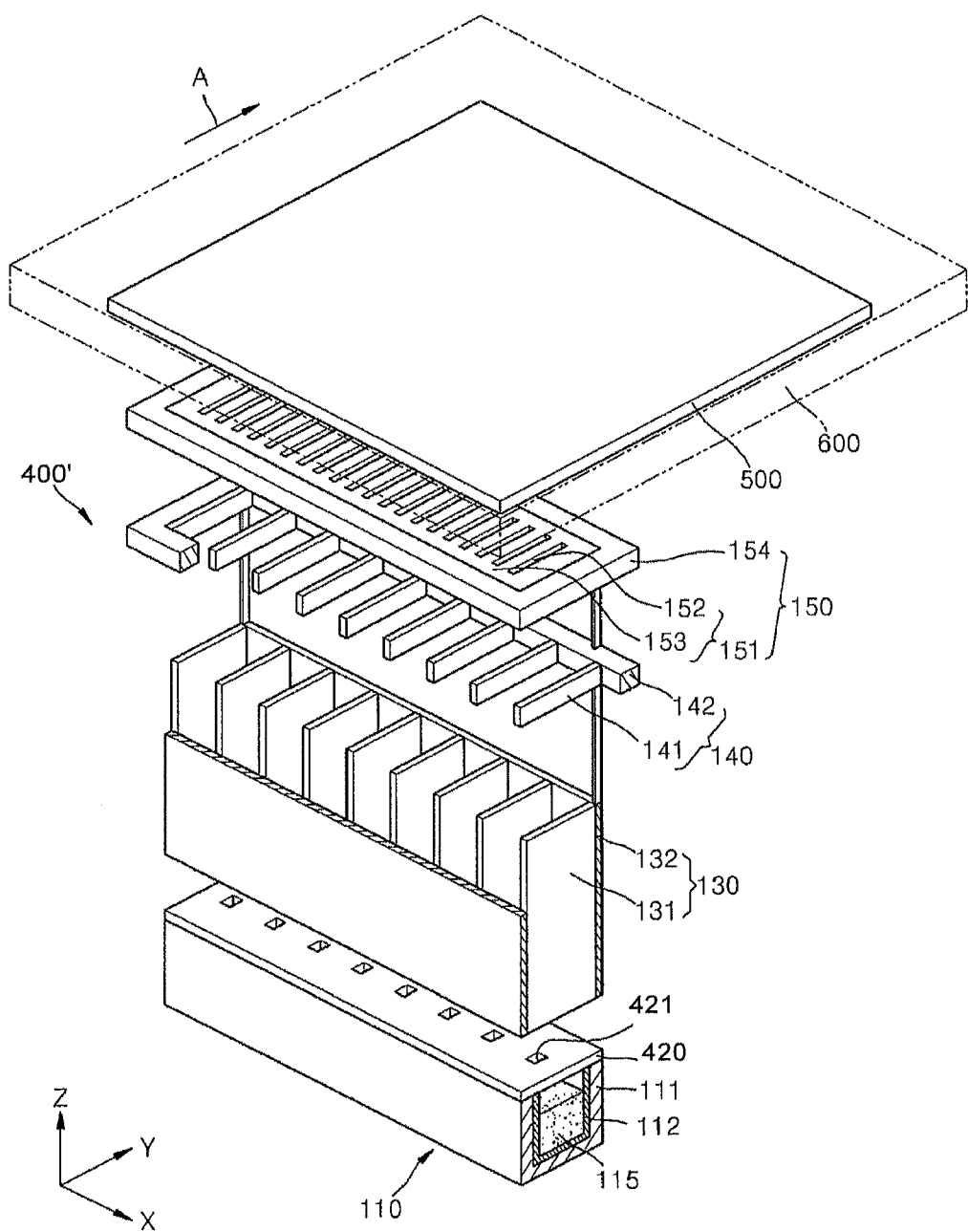
FIG. 12 is a schematic perspective view of an organic layer deposition apparatus according to another embodiment of the present invention.

FIG. 12 is a schematic perspective view of an organic layer deposition apparatus 400' according to another embodiment of the present invention.

Referring to FIG. 12, the organic layer deposition apparatus 400' includes the deposition source 110, the deposition source nozzle unit 420, the first barrier plate assembly 130, a second barrier plate assembly 140, and the patterning slit sheet assembly 150. In one embodiment, although not illustrated in FIG. 12 for purposes of clarity, the components of the organic layer deposition apparatus 400' may be disposed within a chamber (not shown) that is maintained at an appropriate degree of vacuum. The chamber may be maintained at an appropriate degree of vacuum in order to allow the deposition material 115 to move in a substantially straight line through the organic layer deposition apparatus 400'.

The substrate 500, which is a deposition target substrate, is disposed in the chamber. The deposition source 110 that contains and heats the deposition material 115 is disposed at an opposite side of the chamber to a side at which the substrate 500 is disposed. The structure of the deposition source 110 may be the same as that of the organic layer deposition apparatus 100 described above with reference to FIGS. 4 through 6, and thus a detailed description thereof will not be repeated here. The first barrier plate assembly 130 may also be configured the same as that of the organic layer deposition apparatus 400 described above and shown in FIGS. 9 through 11, and thus a detailed description thereof will not be repeated here.

In one embodiment, the patterning slit sheet assembly 150 of the organic layer deposition apparatus 400' includes the patterning slit sheet 151, the frame 154, and the shielding unit 155, and may have the same structure as described above, and thus further description will not be repeated here.

In one embodiment, the second barrier plate assembly 140 is disposed at a side of the first barrier plate assembly 130. The second barrier plate assembly 140 includes a plurality of second barrier plates 141 and a second barrier plate frame 142 that covers sides of the second barrier plates 141.

The second barrier plates 141, in one embodiment, may be arranged parallel to each other at intervals (e.g., equal intervals) in the X-axis direction. Each of the plurality of second barrier plates 141 may be formed to extend in a Y-Z plane in FIG. 12 (i.e. perpendicular to the X-axis direction).

The plurality of first barrier plates 131 and the plurality of second barrier plates 141 arranged as described above partition a deposition space between the deposition source nozzle unit 420 and the patterning slit sheet assembly 150. In one embodiment, the deposition space is divided by the plurality of first barrier plates 131 and the plurality of second barrier plates 141 into sub-deposition spaces that respectively correspond to the plurality of deposition source nozzles 421 through which the deposition material 115 is discharged.

In one embodiment, the plurality of second barrier plates 141 may be disposed to respectively correspond to the plurality of first barrier plates 131. In other words, the plurality of second barrier plates 141 may be aligned with respect to the plurality of first barrier plates 131, respectively. That is, each pair of the corresponding first and second barrier plates 131 and 141 may be located on the same plane. In one embodiment, the first barrier plates 131 and the second barrier plates 141 respectively have the same thickness in the X-axis direction, but embodiments of the present invention are not limited thereto. For example, in another embodiment, the second barrier plates 141 are aligned with a plurality of slits of a slit unit 152 of the patterning slit sheet 151 and may be formed to be relatively thin, whereas the first barrier plates 131, may not be as precisely aligned with the plurality of slits and may be formed to be relatively thick. Such an embodiment facilitates manufacturing of the organic layer deposition assembly 100.

In one embodiment, a plurality of the organic layer deposition apparatuses 400' may be consecutively arranged, as described above with respect to the embodiment shown in FIG. 8.

Figure 13:
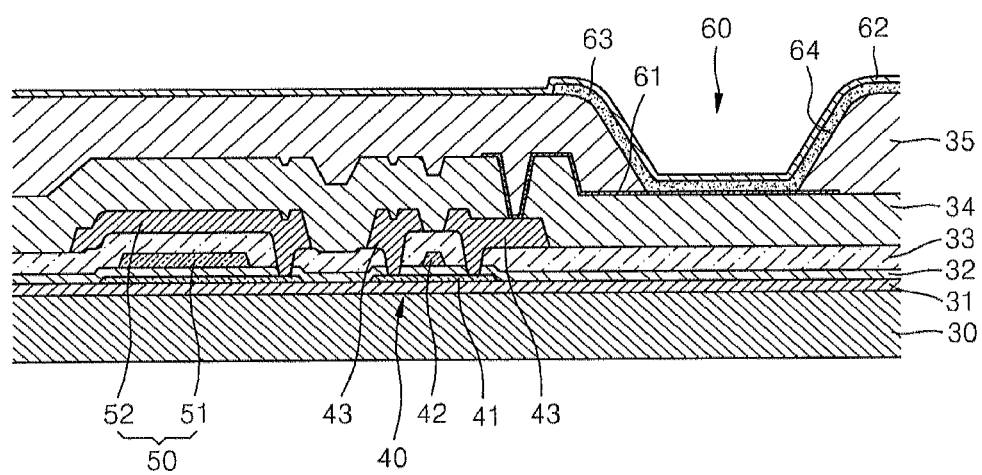
FIG. 13 is a schematic cross-sectional view of an organic light-emitting display device manufactured by using an organic layer deposition apparatus, according to an embodiment of the present invention.

FIG. 13 is a schematic cross-sectional view of an organic light-emitting display device manufactured by using an organic layer deposition apparatus, according to an embodiment of the present invention.

Referring to FIG. 13, the organic light-emitting display device is formed on a substrate 30. The substrate 30 may be formed of a transparent material, such as glass, plastic, or metal. A buffer layer 31 containing an insulating material is formed on an entire surface of the substrate 30.

In one embodiment, a thin film transistor (TFT) 40, a capacitor 50, and an organic light-emitting device (OLED) 60 are disposed on the buffer layer 31. The TFT 40 includes an active layer 41, a gate electrode 42, and a source/drain electrode 43. The OLED 60 includes a first electrode 61, a second electrode 62, and an intermediate layer 63.

In one embodiment, the active layer 41 is formed in a pattern (e.g., a predetermined pattern) on the buffer layer 31.

The active layer 41 may include a p-type or n-type semiconductor material. A gate insulating layer 32 is formed on the active layer 41. The gate electrode 42 is formed on a region of the gate insulating layer 32 corresponding to the active layer 41. An interlayer insulating layer 33 is formed covering the gate electrode 42, and the source/drain electrode 43 may be disposed on the interlayer insulating layer 43 to contact a predetermined region of the active layer 41. A passivation layer 34 is formed covering the source/drain electrode 43, and an additional insulating layer may be formed on the passivation layer 34 to planarize the passivation layer 34.

The first electrode 61 is formed on the passivation layer 34. The first electrode 61 is electrically connected to the drain electrode 43. A pixel defining layer 35 is formed covering the first electrode 61. An opening 64 is formed in the pixel defining layer 35, and the intermediate layer 63 including an organic emission layer (not shown) is formed in a region defined by the opening 64. The second electrode 62 is formed on the intermediate layer 63.

The intermediate layer 63 including the organic emission layer may be formed by using a patterning slit sheet assembly and an organic layer deposition apparatus according to embodiments of the present invention, such as the patterning slit sheet assembly 150 and the organic layer deposition apparatus 100 including the patterning slit sheet assembly 150 described above and shown in FIG. 4.

In one embodiment, after the opening 64 is formed in the pixel defining layer 35, the substrate 30 is transferred into a chamber (not shown). Then, a deposition process is performed using a desired deposition material to form the intermediate layer 63 in a desired pattern.

The organic layer deposition apparatuses according to the above-described embodiments of the present invention may be applied to form an organic or inorganic layer of an organic TFT, for example, and to form layers from various materials.

As described above, according to embodiments of the present invention, a deposition process may be performed to deposit a thin film in a fine pattern by using a patterning slit sheet assembly, an organic layer deposition apparatus, or a method of manufacturing an organic light-emitting display apparatus, and, according to another embodiment, the organic light-emitting display apparatus having the thin film deposited thereon may be manufactured.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:
    forming a first electrode on a substrate;
    forming an intermediate layer including an organic emission layer on the first electrode; and
    forming a second electrode on the intermediate layer,
    wherein the forming of the intermediate layer is performed using an organic layer deposition apparatus including:
        a deposition source for discharging a deposition material;
        a deposition source nozzle unit arranged at a side of the deposition source and including a plurality of deposition source nozzles arranged in a first direction; and
        a patterning slit sheet assembly including;
            a patterning slit sheet including a slit unit having a plurality of slits, and non-slit region that is located along edges of the slit unit, the patterning slit sheet being smaller than the substrate in at least one of the first direction or a second direction perpendicular to the first direction;
            a frame combined with the patterning slit sheet to support the patterning slit sheet, a surface of the frame facing away from the deposition source being combined with a surface of the patterning alit sheet facing toward the deposition source in a state that a tensile force is applied to the patterning slit sheet and a compression force is applied to the frame; and
            a shielding unit comprising a first portion extending on a first inner side of the frame to a first inner edge overlapping an area including an edge of the edges of the slit unit and at least a portion of at least one of the slits, and a second portion extending on a second inner side of the frame opposite the first inner side to a second inner edge overlapping an area including another edge of the edges of the slit unit, and at least a portion of at least one of the slits, the first and second inner edges being spaced apart in the second direction and corresponding to edge portions of a deposition area on the substrate, the first portion extending continuously on the first inner side of the frame from a third inner side of the frame to a fourth inner side of the frame opposite the third inner side, and the second portion extending continuously on the second inner side of the frame from the third inner side of the frame to the fourth inner side of the frame,
    wherein the substrate is s ved apart from the organic layer deposition apparatus by a predetermined distance, and deposition is performed while at least one of the substrate or the organic layer deposition apparatus is moved relative to the other in the first direction.

2. A method of manufacturing an organic tight-emitting display apparatus, the method comprising:
    forming a first electrode on a substrate;
    forming an intermediate layer including an organic emission layer on the first electrode; and
    forming a second electrode on the intermediate layer,
    wherein the forming of the intermediate layer is performed using an organic layer deposition apparatus including:
        a deposition source for discharging, a deposition material;
        a deposition source nozzle unit arranged at a side of the deposition source and including a plurality of deposition source nozzles arranged in a first direction;
        a patterning slit sheet assembly including:
            a patterning slit sheet including a slit unit having a plurality of slits, and a non-slit region that is located along edges of the slit unit, the patterning slit sheet being smaller than the substrate in at least one of the first direction or a second direction perpendicular to the first direction;
            a frame combined with the patterning slit sheet to support the patterning slit sheet, a surface of the frame facing away from the deposition source being combined with a surfaces of the patterning slit sheet facing toward the deposition source in a state that a tensile force is applied to the patterning slit sheet and a compression force is applied to the frame; and
            a shielding unit comprising a first portion extending on a first inner side of the frame to a first inner edge overlapping an area including an edge of the edges of the slit unit and at least a portion of at least one of the slits, and a second portion extending on a second inner side of the frame opposite the first inner side to a second inner edge overlapping an area including another edge of the edges of the slit unit and at least a portion of at least one of the slits, the first and second inner edges being spaced apart in the first direction and corresponding to edge portions of a deposition area on the substrate, the first portion extending continuously on the first inner side of the frame from a third inner side of the frame to a fourth inner side of the frame opposite the third inner side, and the second portion extending continuously on the second inner side of the frame from the third inner side of the frame to the fourth inner side of the frame; and a barrier plate assembly including a plurality of barrier plates arranged between the deposition source nozzle unit and the patterning slit sheet assembly in the first direction and partitioning a space between the deposition source nozzle unit and the patterning slit sheet assembly into a plurality of sub-deposition spaces, wherein the substrate is spaced apart from the organic layer deposition apparatus by a predetermined distance, and deposition is performed while at least one of the substrate or the organic layer deposition apparatus is moved relative to the other.

3. The method of claim 1, wherein the shielding unit is arranged on two inner side surfaces that face each other from among inner side surfaces of the frame.

4. The method of claim 1, wherein the shielding unit is formed covering inner side surfaces of the frame.

5. The method of claim 1, wherein the slit unit overlaps the deposition area on the substrate, and is larger than the deposition area.

6. The method of claim 1, wherein the shielding unit is arranged between the deposition source nozzle unit and the patterning silt sheet, and is spaced apart from the patterning slit sheet.

7. The method of claim 1, wherein the shielding unit is arranged on two inner side surfaces that face each other from among inner side surfaces of the frame.

8. The method of claim 2, wherein the shielding unit is formed covering inner side surfaces of the frame.

9. The method of claim 2, wherein the slit unit overlaps the deposition area on the substrate, and is larger than the deposition area.

10. The method of claim 2, wherein the shielding unit is arranged between the deposition source nozzle unit and the patterning slit sheet, and is spaced apart from the patterning slit sheet.

\* \* \* \* \*